(12) United States Patent
Ozeki et al.

(10) Patent No.: US 11,774,820 B2
(45) Date of Patent: Oct. 3, 2023

(54) DISPLAY DEVICE

(71) Applicant: Japan Display Inc., Tokyo (JP)

(72) Inventors: Yoshitaka Ozeki, Tokyo (JP); Gen Koide, Tokyo (JP); Nobutaka Ozaki, Tokyo (JP); Koshiro Moriguchi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/674,364

(22) Filed: Feb. 17, 2022

(65) Prior Publication Data

US 2022/0308377 A1    Sep. 29, 2022

(30) Foreign Application Priority Data

Mar. 29, 2021 (JP) ................. 2021-056085

(51) Int. Cl.
| | | |
|---|---|---|
| *G02F 1/1368* | (2006.01) |
| *G02F 1/1343* | (2006.01) |
| *G02F 1/1362* | (2006.01) |
| *H01L 27/12* | (2006.01) |
| *H01L 29/786* | (2006.01) |
| *G02F 1/1333* | (2006.01) |

(52) U.S. Cl.
CPC ...... *G02F 1/1368* (2013.01); *G02F 1/134309* (2013.01); *G02F 1/136209* (2013.01); *G02F 1/136286* (2013.01); *H01L 27/124* (2013.01); *H01L 27/1225* (2013.01); *H01L 29/7869* (2013.01); *H01L 29/78633* (2013.01); *G02F 1/13439* (2013.01); *G02F 1/133308* (2013.01)

(58) Field of Classification Search
CPC ............. G02F 1/1368; G02F 1/134309; G02F 1/136209; G02F 1/136286; G02F 1/133308; G02F 1/13439; H01L 27/124
See application file for complete search history.

(56) References Cited

U.S. PATENT DOCUMENTS

2011/0058116 A1   3/2011  Yamazaki et al.
2022/0276540 A1*  9/2022  Wang .................... H01L 27/127

FOREIGN PATENT DOCUMENTS

JP    2014-146819 A    8/2014
JP    2015-159315 A    9/2015

* cited by examiner

*Primary Examiner* — James A Dudek
(74) *Attorney, Agent, or Firm* — K&L Gates LLP

(57) ABSTRACT

A display device includes a first transistor provided with an oxide semiconductor layer, a first gate electrode facing the oxide semiconductor layer and a first gate insulation layer between the oxide semiconductor layer and the first gate electrode, a first transparent conductive layer in contact with the oxide semiconductor layer in a first contact area not overlapping the first gate electrode in a plan view, and a second transparent conductive layer connected to the first transparent conductive layer in a second contact area overlapping the first gate electrode in a plan view and provided in a display area of the pixel.

19 Claims, 17 Drawing Sheets

DISPLAY DEVICE

CROSS REFERENCE TO RELATED APPLICATIONS

This application is based upon and claims the benefit of priority from the prior Japanese Patent Application No. 2021-056085 filed on Mar. 29, 2021, the entire contents of which are incorporated herein by reference.

FIELD

One embodiment of the present invention relates to a display device. In particular, one embodiment of the present invention relates to a display device using a transistor having an oxide semiconductor.

BACKGROUND

Recently, a transistor using an oxide semiconductor as a channel has been developed in place of an amorphous silicon, a low-temperature polysilicon, and a single-crystal silicon (e.g., Japanese laid-open patent publication No. 2014-146819 and Japanese laid-open patent publication No. 2015-159315). The transistor using the oxide semiconductor as the channel is formed in a simple-structured, low-temperature process similar to a transistor using an amorphous silicon as a channel. It is known that the transistor using the oxide semiconductor as the channel has higher mobility than the transistor using the amorphous silicon as the channel and has a very low off-current.

In recent years, due to the advancement in the technology for reducing of the size of a pixel in modern display devices, it has also become possible to reduce the width of wiring and the size of transistors. However, there is a limitation to these reductions, and an aperture ratio is reduced due to arrangements of a metal layer and a semiconductor layer constituting a pixel circuit. Therefore, the development for using the oxide semiconductor layer as the channel of the transistor in the pixel circuit, which obtains sufficient characteristics in spite of its miniaturized size is progressing.

In the transistor using the low-temperature polysilicon as the channel, a silicon layer and a transparent conductive layer (e.g., ITO) used as a pixel electrode cannot be directly in contact with each other. Therefore, it is necessary to provide a pedestal of a metal layer between the silicon layer and the transparent conductive layer. If such a pedestal is arranged in a display area of a pixel, there is a problem whereby an aperture ratio of the pixel is reduced. The technical idea regarding such a contact structure is common to the transistor using the oxide semiconductor as the channel, and the structure forming the transparent conductive layer on the pedestal of the metal layer is commonly used.

SUMMARY

A display device according to an embodiment of the present disclosure includes: a first transistor provided with an oxide semiconductor layer, a first gate electrode facing the oxide semiconductor layer and a first gate insulating layer between the oxide semiconductor layer and the first gate electrode; a first transparent conductive layer overlapping the first gate electrode and the oxide semiconductor layer in a plan view, the first transparent conductive layer being in contact with the oxide semiconductor in a first contact area not overlapping the first gate electrode; and a second transparent conductive layer overlapping the first gate electrode, the oxide semiconductor layer and the first transparent conductive layer in a plan view, the second transparent conductive layer being connected to the first transparent conductive layer in a second contact area overlapping the first gate electrode.

A display device according to an embodiment of the present disclosure includes: a first pixel; and a second pixel to which a pixel signal is supplied from a first wiring. Each of the first pixel and the second pixel includes: a pixel transistor provided with an oxide semiconductor layer, a gate electrode facing the oxide semiconductor layer and a gate insulating layer between the oxide semiconductor layer and the gate electrode; a first transparent conductive layer overlapping the gate electrode and the oxide semiconductor layer in a plan view, the first transparent conductive layer being in contact with the oxide semiconductor in a first contact area not overlapping the first gate electrode; a second transparent conductive layer overlapping the gate electrode, the oxide semiconductor layer, and the first transparent conductive layer in a plan view, the second transparent conductive layer being connected to the first transparent conductive layer in a second contact area overlapping the gate electrode. The second transparent conductive layer of the first pixel overlaps the oxide semiconductor layer of the first pixel and the oxide semiconductor layer of the second pixel.

A display device according to an embodiment of the present disclosure includes: a first pixel and a second pixel to which a pixel signal is supplied from a first wiring; and a third pixel and a fourth pixel to which a pixel signal is supplied from a second wiring adjacent to the first pixel. Each of the first pixel and the second pixel includes; a first transistor provided with an oxide semiconductor layer, a gate electrode facing the oxide semiconductor layer and a gate insulating layer between the oxide semiconductor layer and the gate electrode; a first transparent conductive layer overlapping the gate electrode and the oxide semiconductor layer in a plan view, the first transparent conductive layer being in contact with the semiconductor layer in an area not overlapping the gate electrode; and a second transparent conductive layer overlapping the gate electrode, the oxide semiconductor layer and the first transparent conductive layer in a plan view, the second transparent conductive layer connected to the first transparent conductive layer in a second contact area overlapping the gate electrode. The first pixel and the third pixel are adjacent to each other. The second pixel and the fourth pixel are adjacent to each other. The second transparent conductive layer of the first pixel overlaps the oxide semiconductor layer of the first pixel and the oxide semiconductor layer of the second pixel, and overlaps an oxide semiconductor layer of the third pixel.

DESCRIPTION OF EMBODIMENTS

Figure 1:
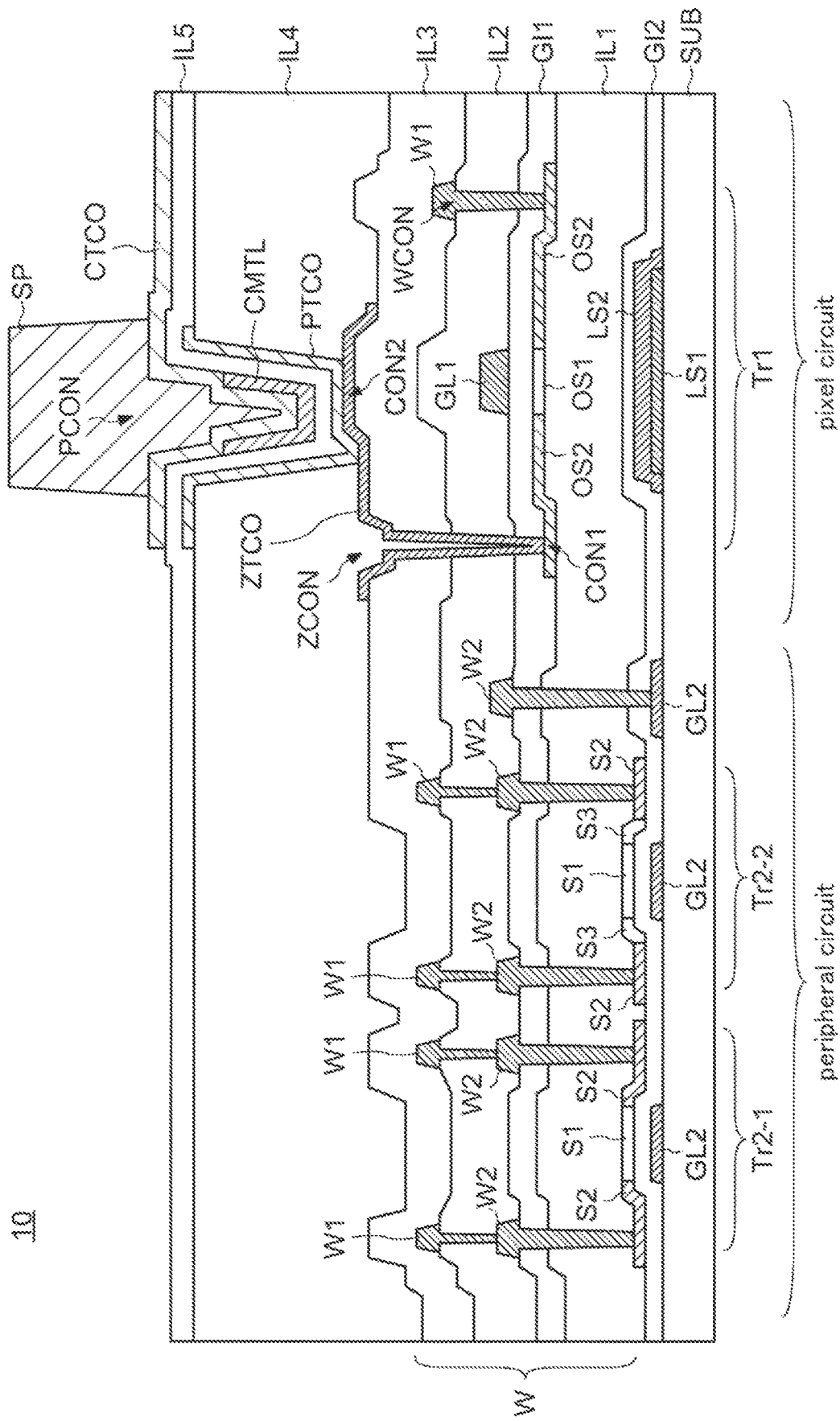
FIG. 1 is a cross-sectional view showing an outline of a display device according to an embodiment of the present invention.

Embodiments of the present invention will be described below with reference to the drawings. The following disclosure is merely an example. A configuration that can be easily conceived by a person skilled in the art by appropriately changing the configuration of the embodiment while maintaining the gist of the invention is naturally included in the scope of the present invention. For the sake of clarity of description, the drawings may be schematically represented with respect to widths, thicknesses, shapes, and the like of the respective portions in comparison with actual embodiments. However, the shape shown is merely an example and does not limit the interpretation of the present invention. In this specification and each of the drawings, the same symbols are assigned to the same components as those described previously with reference to the preceding drawings, and a detailed description thereof may be omitted as appropriate.

In the embodiments of the present invention, a direction from a substrate to an oxide semiconductor layer is referred to as upper or above. On the contrary, a direction from the oxide semiconductor layer to the substrate is referred to as lower or below. As described above, for convenience of explanation, although the phrase "above" or "below" is used for explanation, for example, a vertical relationship between the substrate and the oxide semiconductor layer may be arranged in a different direction from that shown in the drawing. In the following description, for example, the expression "the oxide semiconductor layer on the substrate" merely describes the vertical relationship between the substrate and the oxide semiconductor layer as described above, and other members may be arranged between the substrate and the oxide semiconductor layer. Above or below means a stacking order in a structure in which multiple layers are stacked, when it is expressed as a pixel electrode above a transistor, it may be a positional relationship where the transistor and the pixel electrode do not overlap each other in a plan view. On the other hand, when it is expressed as a pixel electrode vertically above a transistor, it means a positional relationship where the transistor and the pixel electrode overlap each other in a plan view.

"Display device" refers to a structure configured to display an image using electro-optic layers. For example, the term display device may refer to a display panel including the electro-optic layer, or it may refer to a structure in which other optical members (e.g., polarizing member, backlight, touch panel, etc.) are attached to a display cell. The "electro-optic layer" can include a liquid crystal layer, an electroluminescence (EL) layer, an electrochromic (EC) layer, and an electrophoretic layer, as long as there is no technical contradiction. Therefore, although the embodiments described later will be described by exemplifying the liquid crystal display device including a liquid crystal layer as the display device, the structure in the present embodiment can be applied to a display device including the other electro-optical layers described above.

The expressions "α includes A, B, or C", "α includes any of A, B, and C", and "α includes one selected from a group consisting of A, B, and C" do not exclude the case where α includes multiple combinations of A to C unless otherwise specified. Furthermore, these expressions do not exclude the case where α includes other elements.

The following embodiments may be combined with each other as long as there is no technical contradiction.

One of objects of the present embodiment is to realize a brightness improvement of a display device.

1. First Embodiment

1-1. Configuration of Display Device 10

Figure 2:
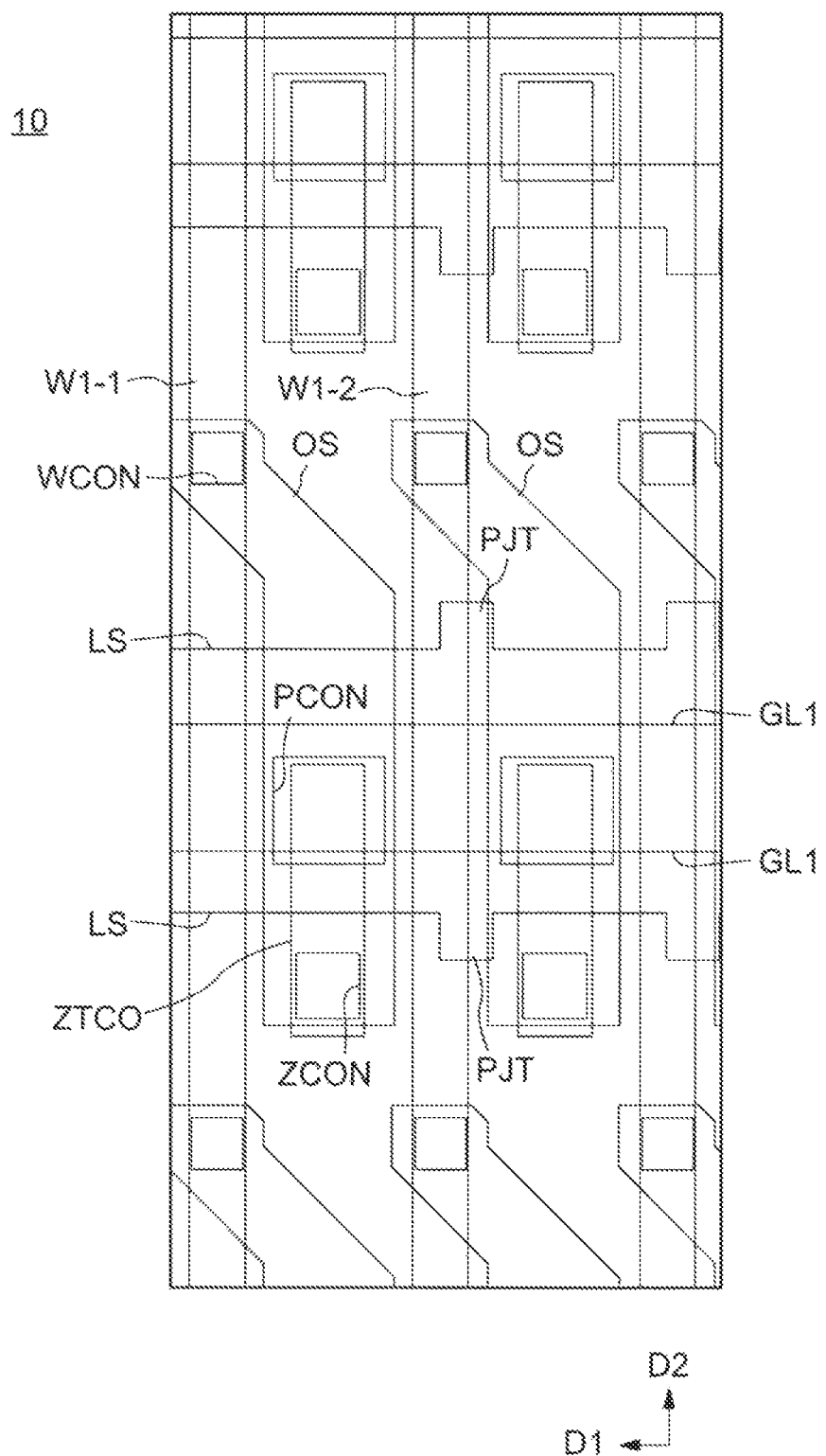
FIG. 2 is a plan view showing an outline of a display device according to an embodiment of the present invention.

A configuration of a display device 10 according to an embodiment of the present invention will be described with reference to FIG. 1 to FIG. 13. FIG. 1 is a cross-sectional view showing an outline of a display device according to an embodiment of the present invention. FIG. 2 is a plan view showing an outline of a display device according to an embodiment of the present invention. FIG. 3 to FIG. 13 are plan views illustrating layouts of each layer in a display device according to an embodiment of the present invention. The cross-sectional view in FIG. 1 is for explaining a layer structure of the display device 10, which may not exactly match the plan view in FIG. 2.

As shown in FIG. 1, the display device 10 includes a substrate SUB. The display device 10 also includes a transistor Tr1, a transistor Tr2, a wiring W, a connecting electrode ZTCO, a pixel electrode PTCO, a common auxiliary electrode CMTL, and a common electrode CTCO on the substrate SUB. TCO is an abbreviation for Transparent Conductive Oxide. The transistor Tr1 is a transistor included in a pixel circuit of the display device 10. The transistor Tr2 is a transistor included in a peripheral circuit. As will be described in detail later, the peripheral circuit is a circuit configured to drive the pixel circuit.

1-2. Configuration of Transistor Tr1

The transistor Tr1 includes an oxide semiconductor layer OS, a gate insulating layer GI1, and a gate electrode GL1. The gate electrode GL1 faces the oxide semiconductor layer OS. The gate insulating layer GI1 is provided between the oxide semiconductor layer OS and the gate electrode GL1. In the present embodiment, although a top gate type transistor in which the oxide semiconductor layer OS is provided closer to the substrate SUB than the gate electrode GL1 is exemplified, a bottom gate type transistor in which a positional relationship between the gate electrode GL1 and the oxide semiconductor layer OS is reversed may be applied.

The oxide semiconductor layer OS includes oxide semiconductor layers OS1, OS2. The oxide semiconductor layer OS1 is an oxide semiconductor layer in an area overlapping the gate electrode GL1 in a plan view. The oxide semiconductor layer OS1 functions as a semiconductor layer and is switched between a conductive state and a non-conductive state according to a voltage supplied to the gate electrode GL1. That is, the oxide semiconductor layer OS1 functions as a channel for the transistor Tr1. The oxide semiconductor layer OS2 functions as a conductive layer. The oxide semiconductor layers OS1, OS2 are layers formed from the same oxide semiconductor layer. For example, the oxide semiconductor layer OS2 is a low resistance oxide semiconductor layer formed by doping impurities into a layer which has the same physical properties as the oxide semiconductor layer OS1.

An insulating layer IL2 is provided above the gate electrode GL1. A wiring W1 is provided above the insulating layer IL2. The wiring W1 is connected to the oxide semiconductor layer OS2 via an opening WCON provided in the insulating layer IL2 and the gate insulating layer GI1. A data signal related to pixel gradation is transmitted to the wiring W1. An insulating layer IL3 is provided above the insulating layer IL2 and the wiring W1. The connecting electrode ZTCO is provided above the insulating layer IL3. The connecting electrode ZTCO is connected to the oxide semiconductor layered OS2 via an opening ZCON provided in the insulating layers IL3, IL2, and the gate insulating layer GI1. The connecting electrode ZTCO is in contact with the oxide semiconductor layer OS2 at the bottom of the opening ZCON. The connecting electrode ZTCO is a transparent conductive layer.

An area where the connecting electrode ZTCO and the oxide semiconductor layers OS2 are in contact with each other is referred to as a first contact area CON1. The connecting electrode ZTCO may be referred to as a "first transparent conductive layer". As will be described in detail later, the first transparent conductive layer is in contact with the oxide semiconductor layer OS2 in the first contact area CON1 not overlapping the gate electrode GL1 and the wiring W1 in a plan view. The first contact area CON1 is included in the display area of a pixel in a plan view.

For example, when a transparent conductive layer such as an ITO layer is formed in contact with a semiconductor layer such as a silicon layer, a surface of the semiconductor layer is oxidized by a process gas or oxygen ions at the time of a deposition of an ITO film. Since an oxide layer formed on the surface of the semiconductor layer is high resistance, a contact resistance between the semiconductor layer and the transparent conductive layer is increased. As a result, there is a defect in an electrical contact between the semiconductor layer and the transparent conductive layer. On the other hand, even if the above transparent conductive layer is formed so as to be in contact with the oxide semiconductor layer, a high resistance oxide layer as described above is not formed on a surface of the oxide semiconductor layer. Therefore, there is no defect in the electrical contact between the oxide semiconductor layer and the transparent conductive layer.

An insulating layer IL4 is provided above the connecting electrode ZTCO. The insulating layer IL4 eases (flattens) a step formed from a structure provided below the insulating layer IL4. The insulating layer IL4 may be referred to as a planarization film. The pixel electrode PTCO is provided above the insulating layer IL4. The pixel electrode PTCO is connected to the connecting electrode ZTCO via an opening PCON provided in the insulating layer IL4. An area where the connecting electrode ZTCO and the pixel electrode PTCO are in contact with each other is referred to as a second contact area CON2. The second contact area CON2 overlaps the gate electrode GL1 in a plan view. The pixel electrode PTCO is a transparent conductive layer.

An insulating layer IL5 is provided above the pixel electrode PTCO. The common auxiliary electrode CMTL and the common electrode CTCO are provided above the insulating layer IL5. That is, the pixel electrode PTCO faces the common electrode CTCO via the insulating layer IL5. The common electrode CTCO is connected to the common auxiliary electrode CMTL at the opening PCON (in the second contact area CON2). As will be described in detail later, the common auxiliary electrode CMTL and the common electrode CTCO have different patterns respectively when seen a plan view. The common auxiliary electrode CMTL is a metal layer. The common electrode CTCO is a transparent conductive layer. The electric resistance of the common auxiliary electrode CMTL is lower than the electric resistance of the common electrode CTCO. The common auxiliary electrode CMTL also functions as a light-shielding layer. For example, the common auxiliary electrode CMTL shields light from adjacent pixels to suppress an occurrence of color mixing. A spacer SP is provided above the common electrode CTCO.

The spacer SP is provided for a part of the pixels. For example, the spacer SP may be provided for any one of a blue pixel, a red pixel and a green pixel. However, the spacer SP may be provided for all the pixels. A height of the spacer SP is half the height of a cell gap. A spacer is also provided on a counter substrate, and the spacer on the counter substrate and the above spacer SP overlap in a plan view.

A light-shielding layer LS is provided between the transistor Tr1 and the substrate SUB. In the present embodiment, light-shielding layers LS1, LS2 are provided as the light-shielding layer LS. However, the light-shielding layer LS may be formed of only the light-shielding layer LS1 or LS2. In a plan view, the light-shielding layer LS is provided in an area where the gate electrode GL1 and the oxide semiconductor layer OS overlap. That is, in a plan view, the light-shielding layer LS is provided in an area overlapping the oxide semiconductor layer OS1. The light-shielding layer LS suppresses the light incident from the substrate SUB side from reaching the oxide semiconductor layer OS1. In the case where a conductive layer is used as the light-shielding layer LS, a voltage may be applied to the light-shielding layer LS to control the oxide semiconductor layer OS1. In the case where a voltage is applied to the light-shielding layer LS, the light-shielding layer LS and the gate electrode GL1 may be connected by a peripheral area of the pixel circuit. In a plan view, the above first contact area CON1 is provided in an area not overlapping the light-shielding layer LS.

1-3. Configuration of Transistor Tr2

The transistor Tr2 has a p-type transistor Tr2-1 and an n-type transistor Tr2-2. The transistor Tr2 may be referred to as a "second transistor."

The p-type transistor Tr2-1 and the n-type transistor Tr2-2 both include a gate electrode GL2, a gate insulating layer GI2, and a semiconductor layer S (S1 and S2, or S1, S2 and S3). The gate electrode GL2 faces the semiconductor layer S. The gate insulating layer GI2 is provided between the semiconductor layer S and the gate electrode GL2. In the present embodiment, although a bottom gate type transistor in which the gate electrode GL2 is provided closer to the substrate SUB than the semiconductor layer S is exemplified, a top gate type transistor in which a positional relationship between the semiconductor layer S and the gate electrode GL2 is reversed may be used as the display device. The gate electrode GL2 may be referred to as a "second gate electrode". The gate insulating layer GI2 may be referred to as a "second gate insulating layer".

The semiconductor layer S of the p-type transistor Tr2-1 includes semiconductor layers S1 and S2. The semiconductor layer S of the n-type transistor Tr2-2 includes the semiconductor layers S1, S2 and S3. The semiconductor layer S1 is a semiconductor layer overlapping the gate electrode GL2 in a plan view. The semiconductor layer S1 functions as a channel for the transistors Tr2-1 and Tr2-2. The semiconductor layer S2 functions as a conductive layer. The semiconductor layer S3 functions as a conductive layer with a higher resistance than the semiconductor layer S2. The semiconductor layer S3 suppresses hot carrier degradation by attenuating hot carriers intruding toward the semiconductor layer S1.

An insulating layer IL1 and the gate insulating layer GI1 are provided on the semiconductor layer S. In the transistor Tr2, the gate insulating layer GI1 simply functions as an interlayer film. A wiring W2 is provided above these insulating layers. The wiring W2 is connected to the semiconductor layer S via an opening provided in the insulating layer IL1 and the gate insulating layer GI1. The insulating layer IL2 is provided on the wiring W2. The wiring W1 is provided on the insulating layer IL2. The wiring W1 is connected to the wiring W2 via an opening provided in the insulating layer IL2.

The gate electrode GL2 and the light-shielding layer LS2 are the same layer. The wiring W2 and the gate electrode GL1 are the same layer. The same layer means that multiple members are formed from one patterned layer.

1-4. Plane Layout of Display Device 10

Figure 12:
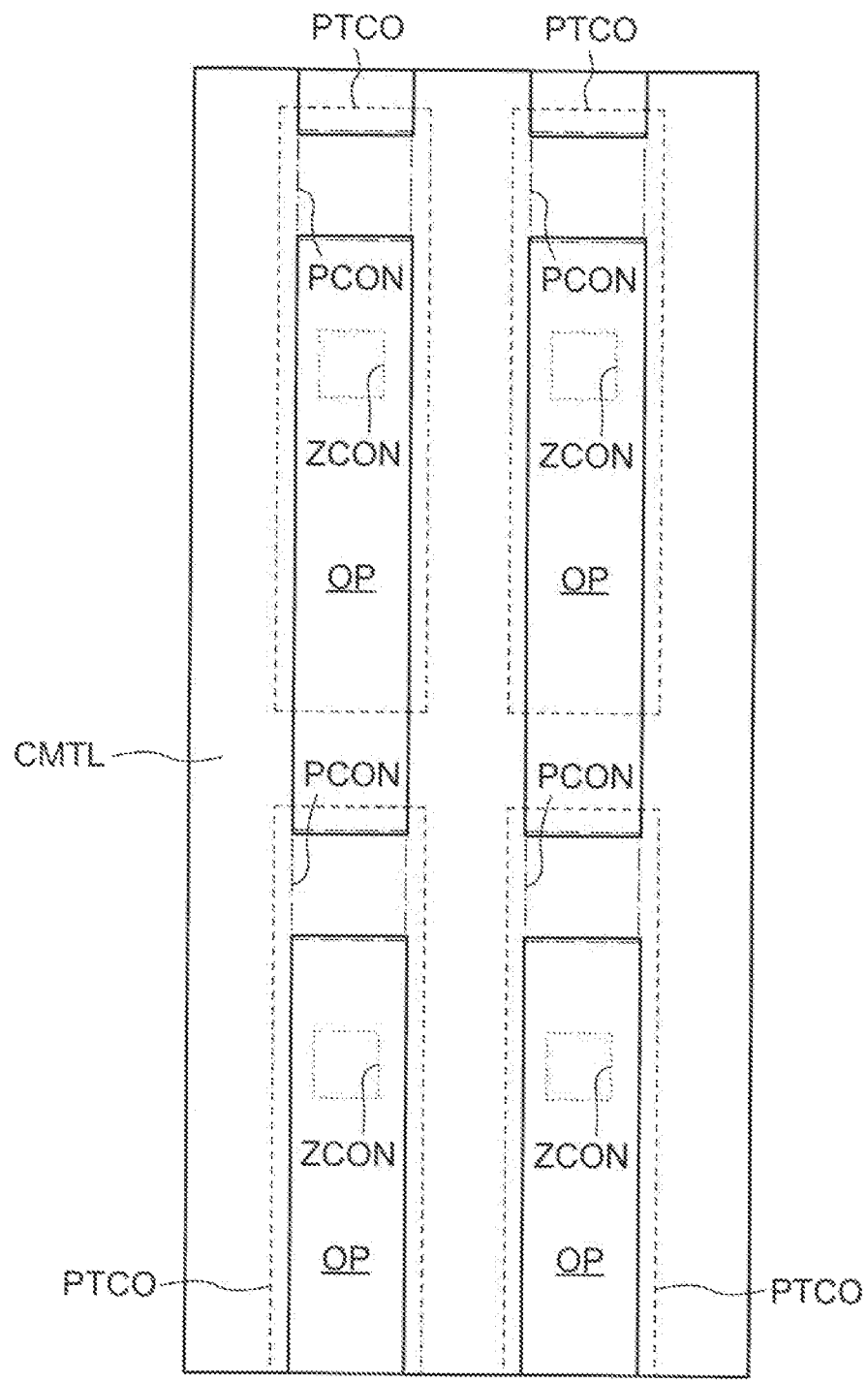
FIG. 12 is a plan view illustrating a layout of one or more layers in a display device according to an embodiment of the present invention.
Figure 13:
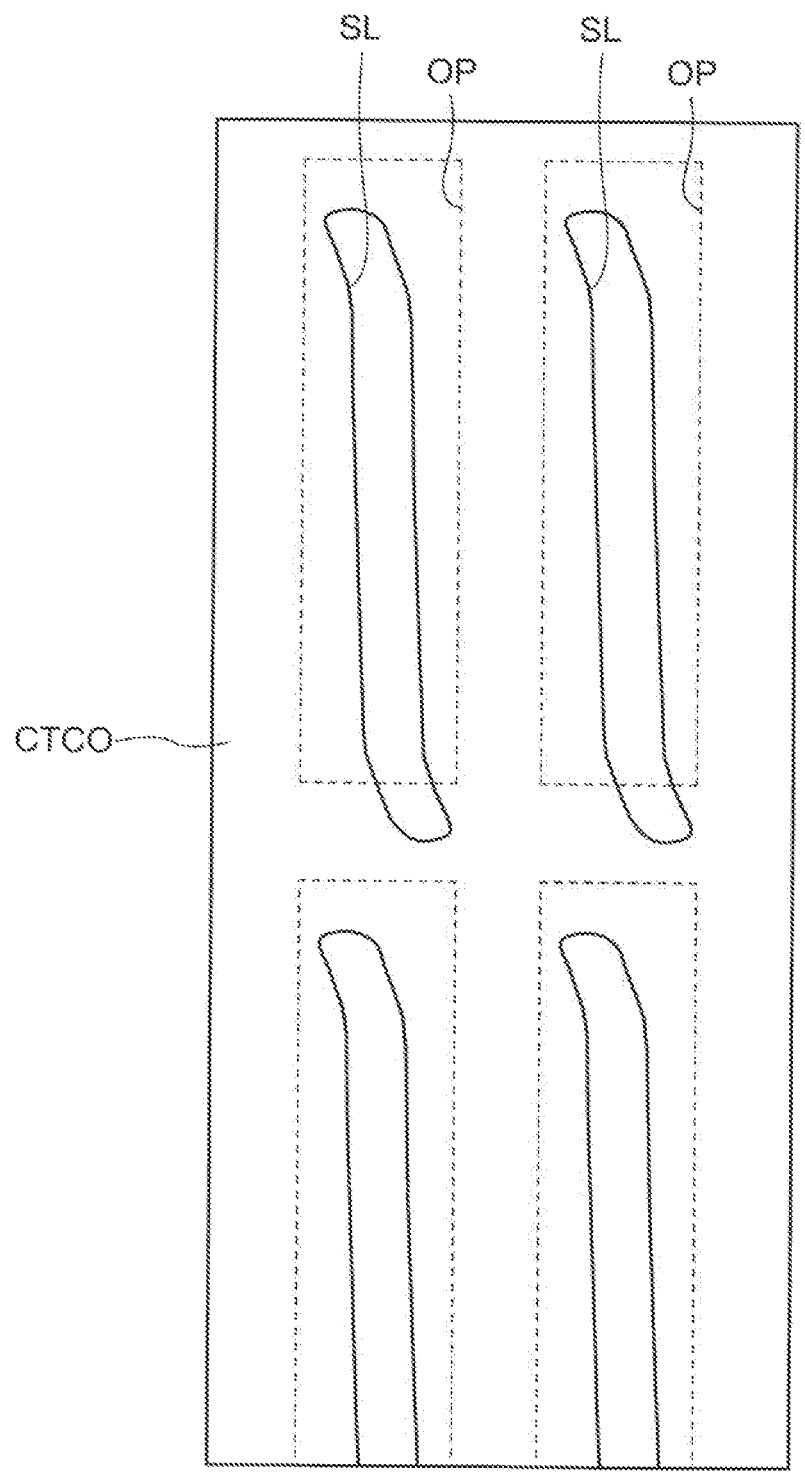
FIG. 13 is a plan view illustrating a layout of one or more layers in a display device according to an embodiment of the present invention.

A plane layout of a pixel of the display device 10 will be described with reference to FIG. 2 to FIG. 13. In FIG. 2, the pixel electrode PTCO, the common auxiliary electrode CMTL, the common electrode CTCO, and the spacer SP are omitted. The plane layout of the pixel electrode PTCO, the common auxiliary electrode CMTL, and the common electrode CTCO are shown in FIG. 11 to FIG. 13, respectively.

Figure 3:
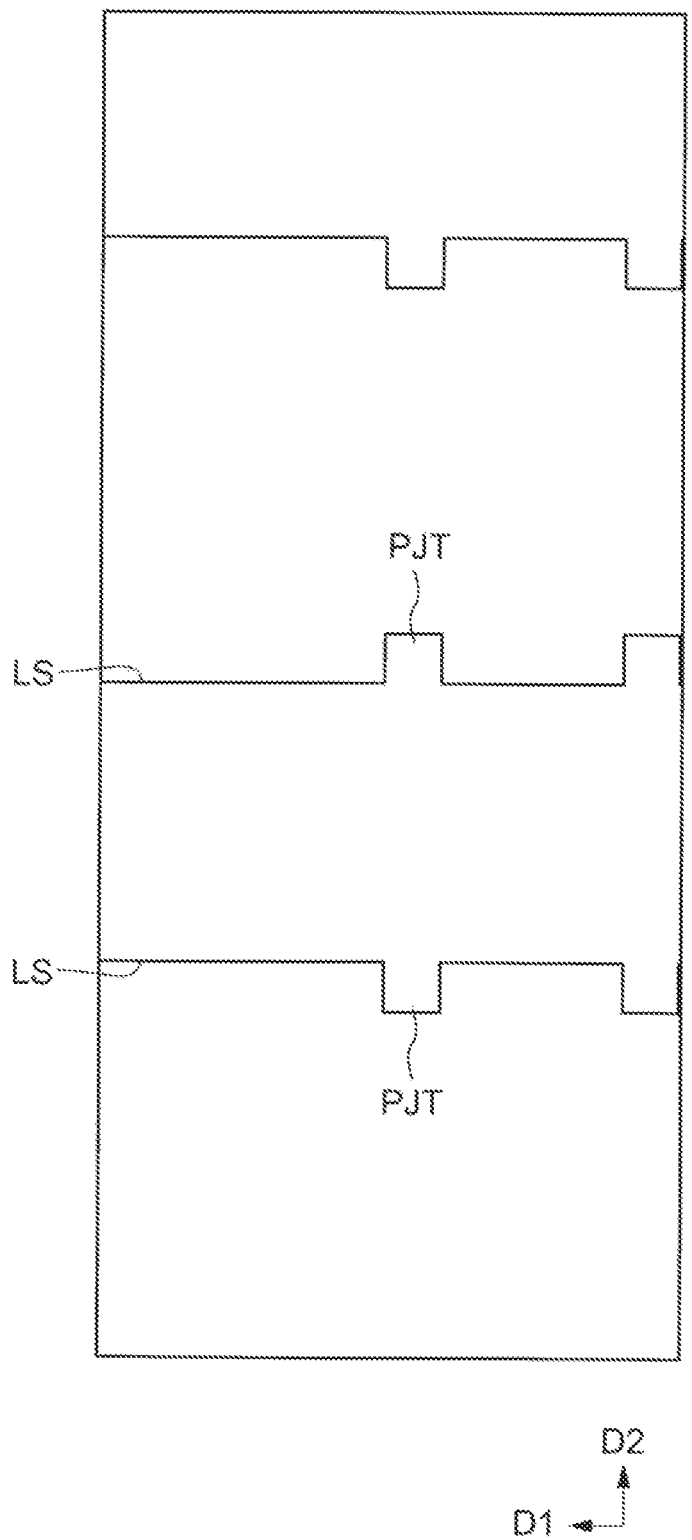
FIG. 3 is a plan view illustrating a layout of each layer in a display device according to an embodiment of the present invention.
Figure 5:
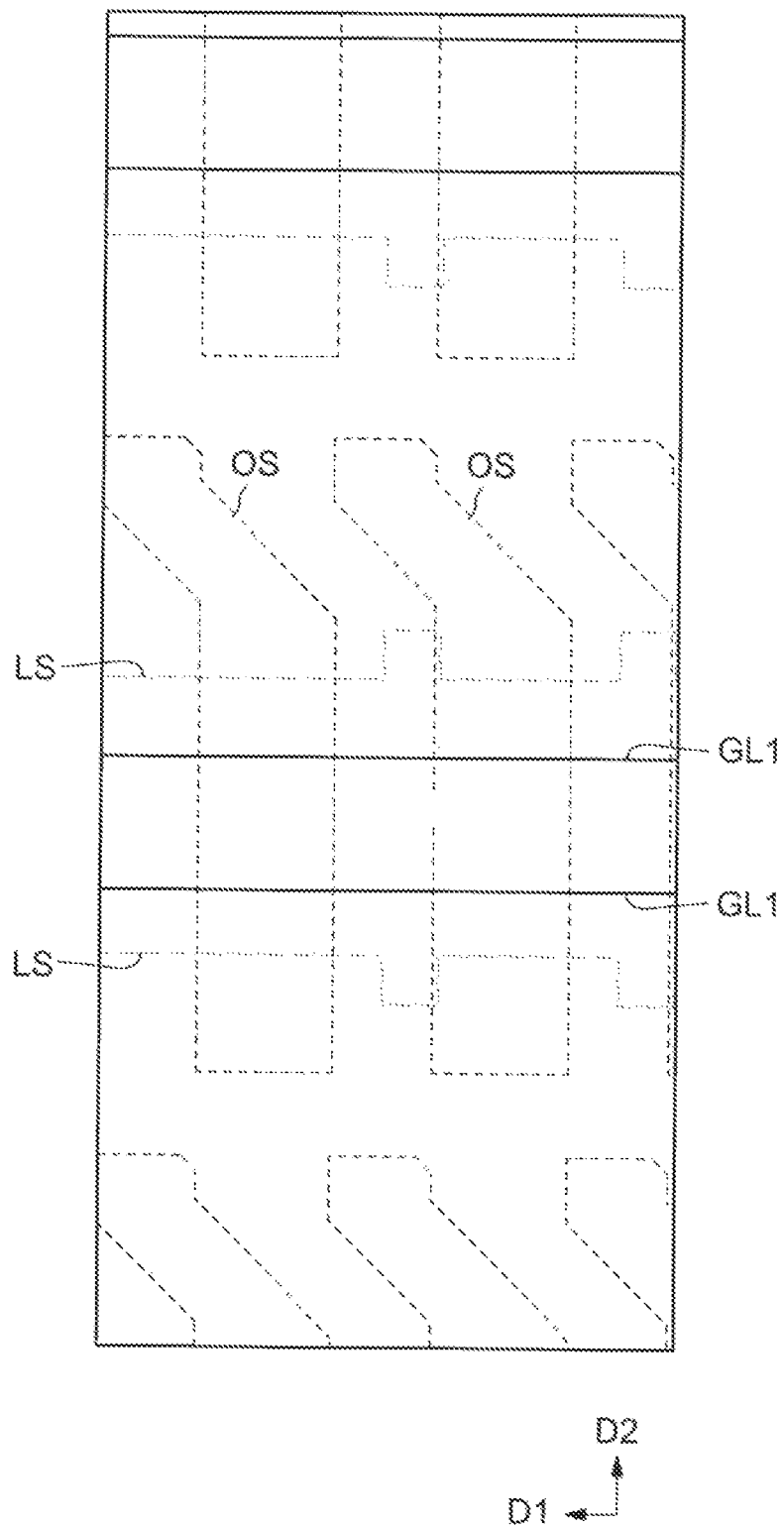
FIG. 5 is a plan view illustrating a layout of one or more layers in a display device according to an embodiment of the present invention.

As shown in FIG. 2 and FIG. 3, the light-shielding layer LS extends in a direction D1. A shape of the light-shielding layer LS may be different depending on the pixel. In the present embodiment, a protruding part PJT protruding in a direction D2 is provided from a part of the light-shielding layer LS extending in the direction D1. As shown in FIG. 5, the light-shielding layer LS is provided in an area including the area where the gate electrode GL1 and the oxide semiconductor layer OS overlap in a plan view. The gate electrode GL1 can also be referred to as a "gate line."

Figure 4:
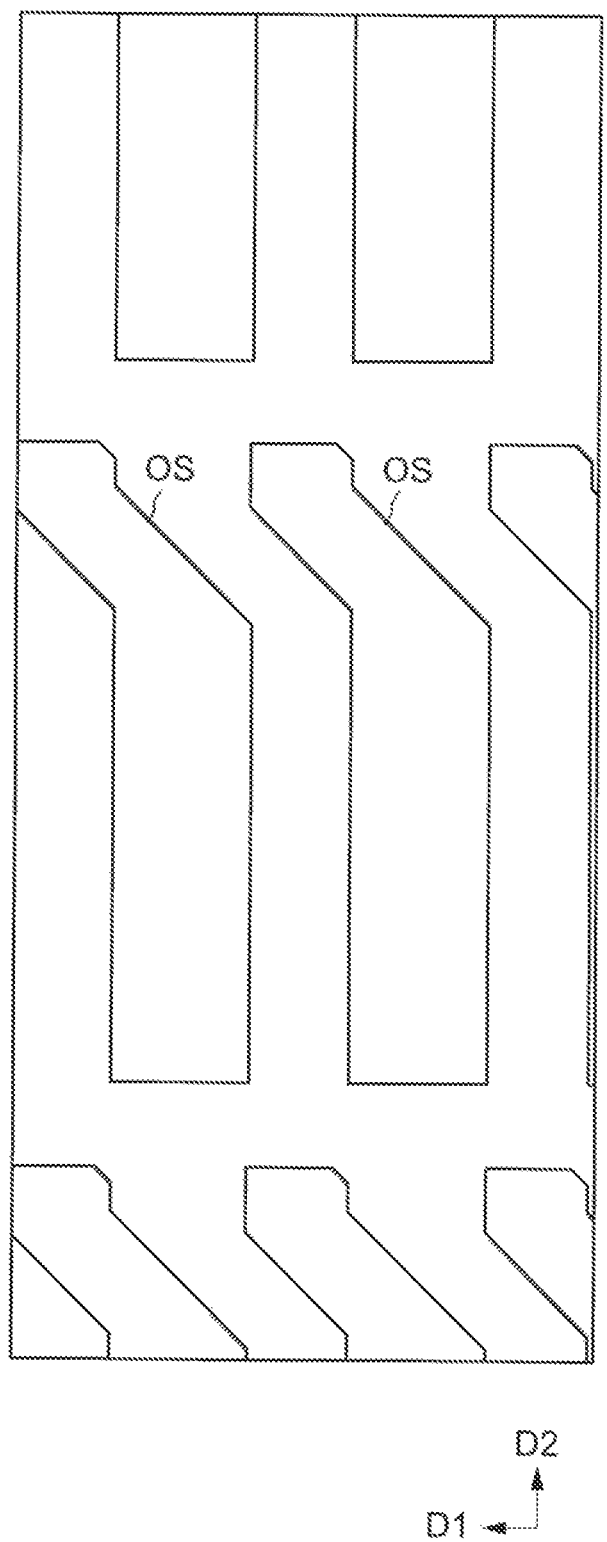
FIG. 4 is a plan view illustrating a layout of one or more layers in a display device according to an embodiment of the present invention.

As shown in FIG. 2, FIG. 4, and FIG. 5, the oxide semiconductor layer OS extends in the direction D2. The gate electrode GL1 extends in the direction D1 so as to intersect the oxide semiconductor layer OS. A pattern of the gate electrode GL1 is provided inside a pattern of the light-shielding layer LS. In other words, the oxide semiconductor layers OS is formed in a long shape intersecting the gate electrode GL1.

Figure 6:
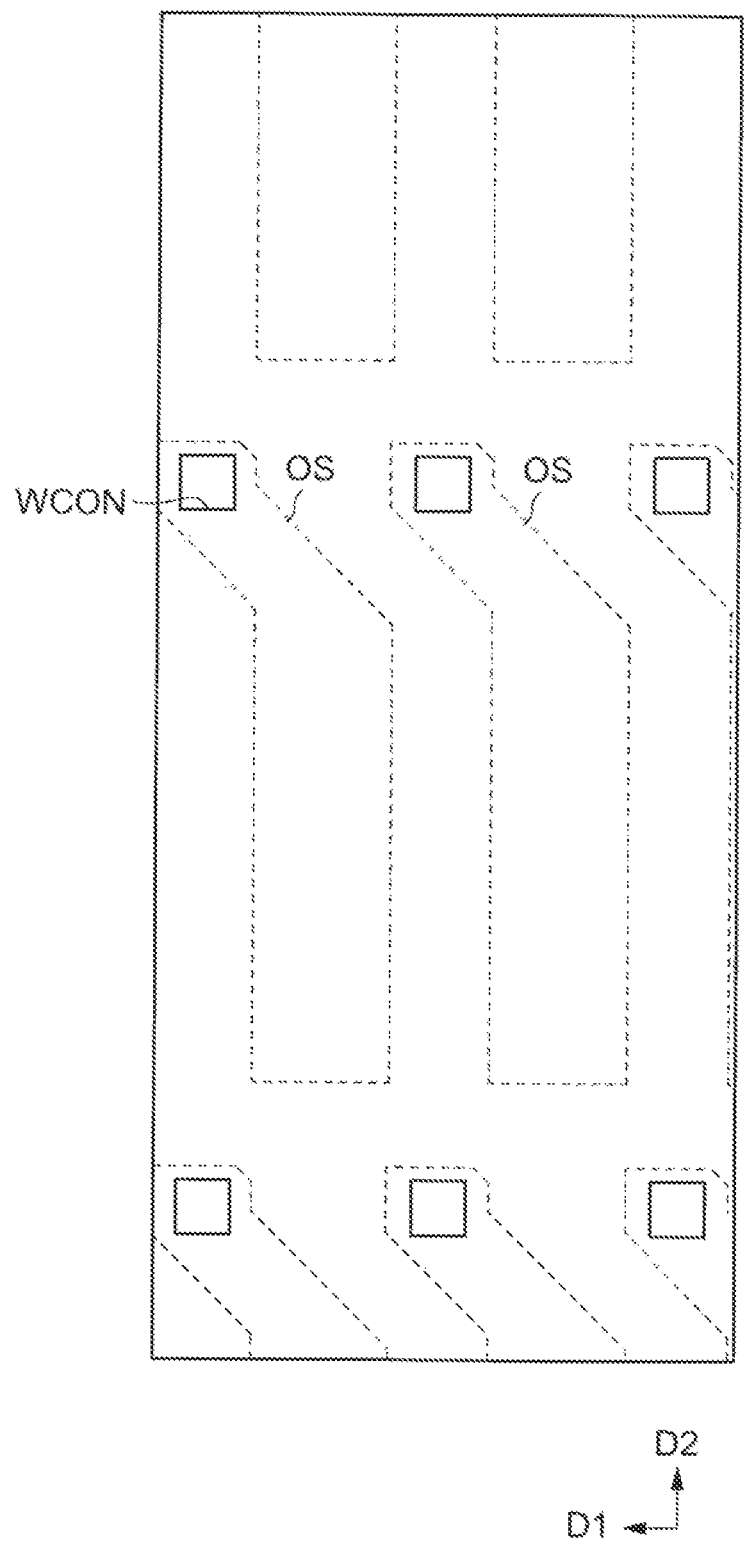
FIG. 6 is a plan view illustrating a layout of one or more layers in a display device according to an embodiment of the present invention.
Figure 7:
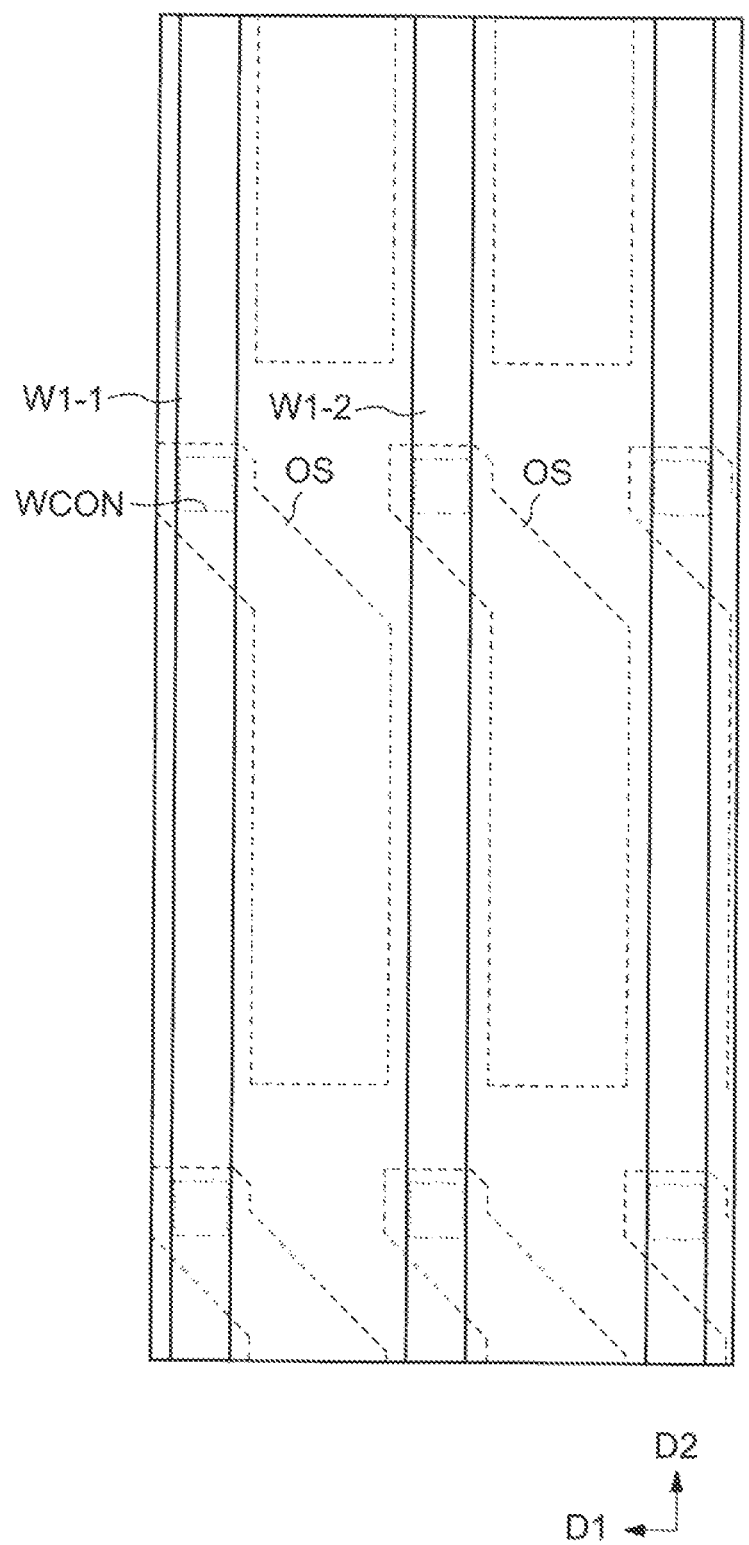
FIG. 7 is a plan view illustrating a layout of one or more layers in a display device according to an embodiment of the present invention.

As shown in FIG. 2, FIG. 6, and FIG. 7, the opening WCON is provided in an area overlapping the wiring W1 near an upper end of the pattern of the oxide semiconductor layer OS. A main part of the pattern of the oxide semiconductor layer OS extends in the direction D2 between a pair of the adjacent wirings W1. The remaining part of the pattern of the oxide semiconductor layer OS extends obliquely in the direction D1 and the direction D2 from the main part and overlaps the opening WCON.

As shown in FIG. 2 and FIG. 7, multiple wirings W1 extend in the direction D2. In the case where the adjacent wirings W1 need to be described separately, the adjacent wiring W1 is referred to as a wiring W1-1 (first wiring) and a wiring W1-2 (second wiring). In this case, it can be said that the main part of the oxide semiconductor layer OS extends in the direction D2 between the first wiring W1-1 and the second wiring W1-2, and intersects the gate electrode GL1. In other words, the oxide semiconductor layer OS is provided in a long shape in the direction D2 (shape having a longitudinal) and connected to the wiring W1-1 (the first wiring) at one end in a longitudinal direction of the oxide semiconductor layer OS.

Figure 8:
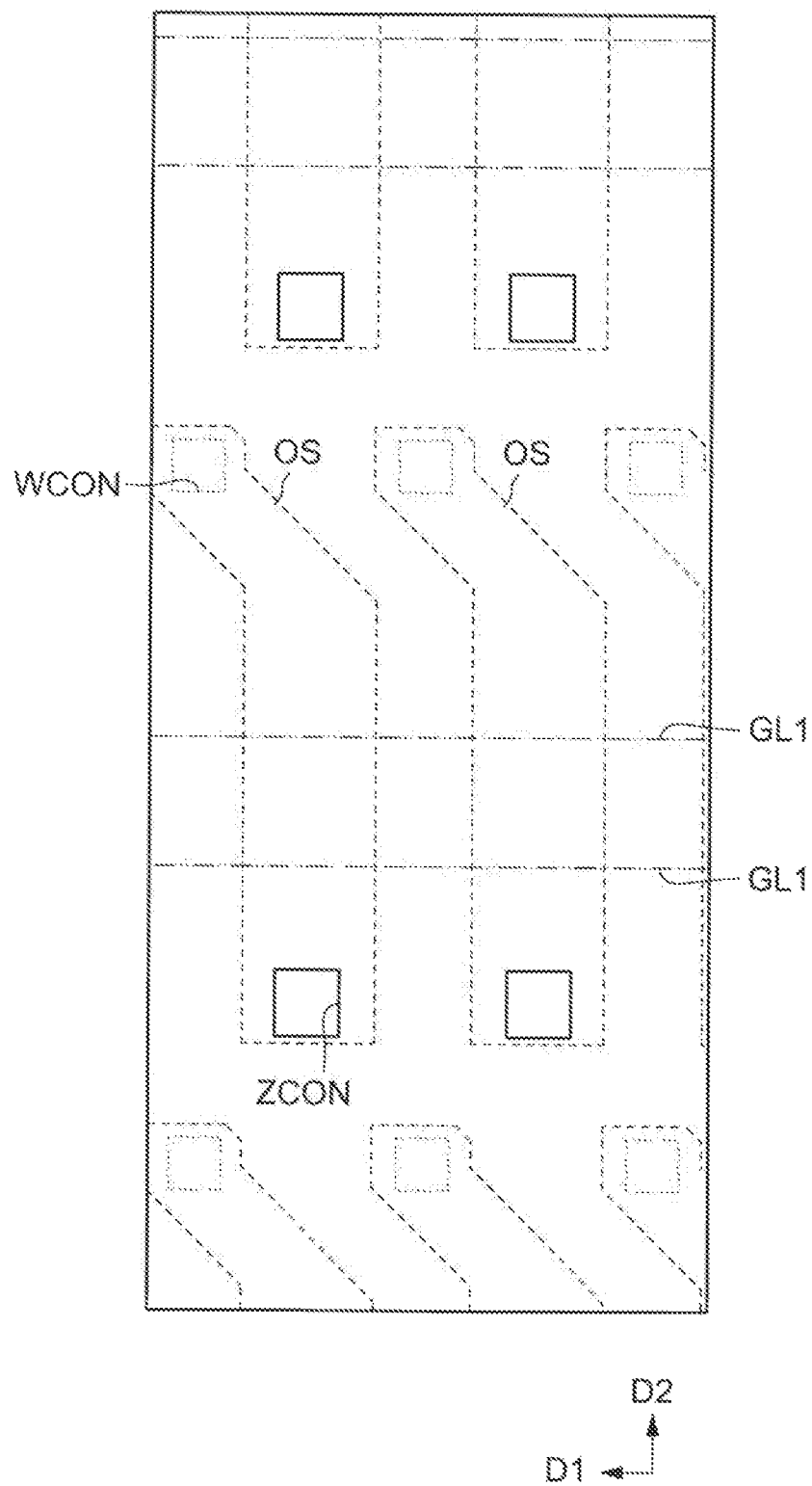
FIG. 8 is a plan view illustrating a layout of one or more layers in a display device according to an embodiment of the present invention.
Figure 9:
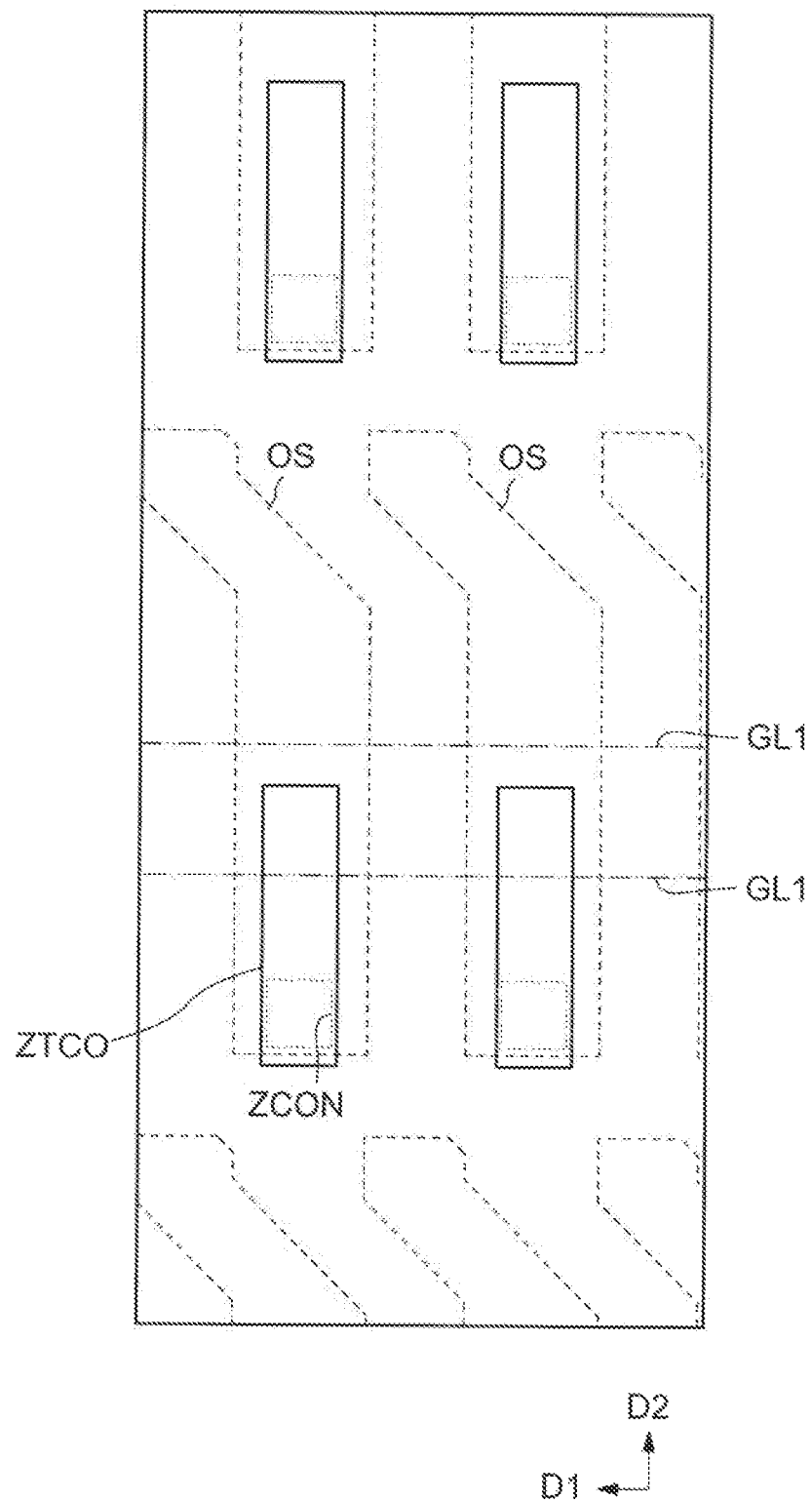
FIG. 9 is a plan view illustrating a layout of one or more layers in a display device according to an embodiment of the present invention.

As shown in FIG. 2, FIG. 8, and FIG. 9, the opening ZCON is provided near a lower end of the pattern of the oxide semiconductor layer OS. The opening ZCON is provided in an area overlapping the pattern of the oxide semiconductor layer OS and not overlapping the gate electrode GL1. The opening ZCON is provided in an area overlapping the connecting electrode ZTCO. The connecting electrode ZTCO overlaps the gate electrode GL1 and the oxide semiconductor layer OS between the wiring W1-1 and the wiring W1-2. Therefore, the connecting electrode ZTCO is in contact with the oxide semiconductor layer OS in the opening ZCON (the first contact area CON1) not overlapping the gate electrode GL1.

In other words, the oxide semiconductor layer OS is connected to the connecting electrode ZTCO (the first transparent conductive layer) at the other end in the longitudinal direction of the oxide semiconductor layer OS. The connecting electrode ZTCO is formed in a long shape extending in the direction D2 similar to the oxide semiconductor layer OS. In the direction D1, a width of the connecting electrode ZTCO is smaller than a width of the oxide semiconductor layer OS.

As shown in FIG. 2, FIG. 7, and FIG. 8, the oxide semiconductor layer OS is in contact with the wiring W1 at the opposite side of the opening ZCON with respect to the gate electrode GL1. The opening ZCON does not overlap with the light-shielding layer LS.

Figure 10:
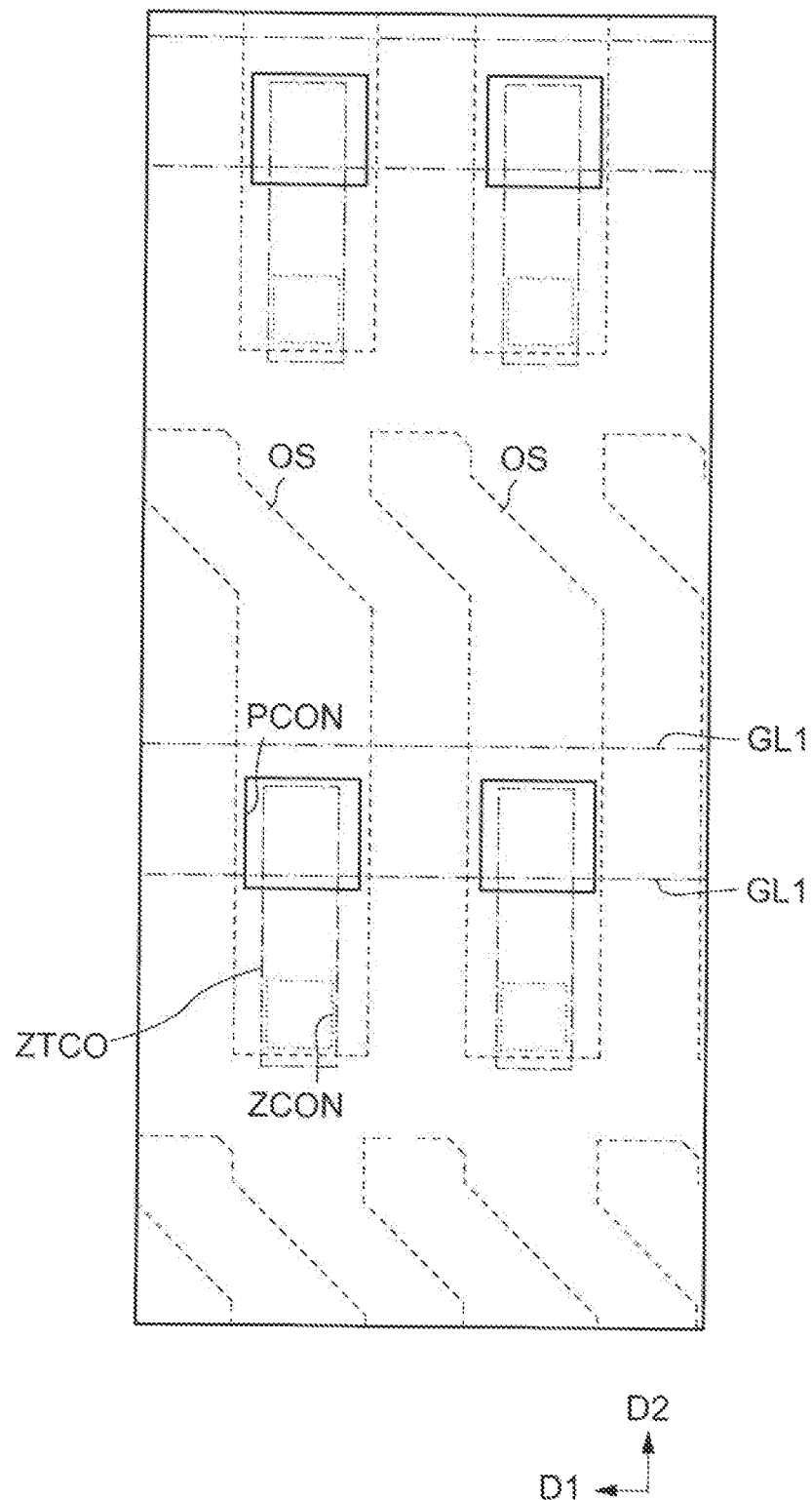
FIG. 10 is a plan view illustrating a layout of one or more layers in a display device according to an embodiment of the present invention.
Figure 11:
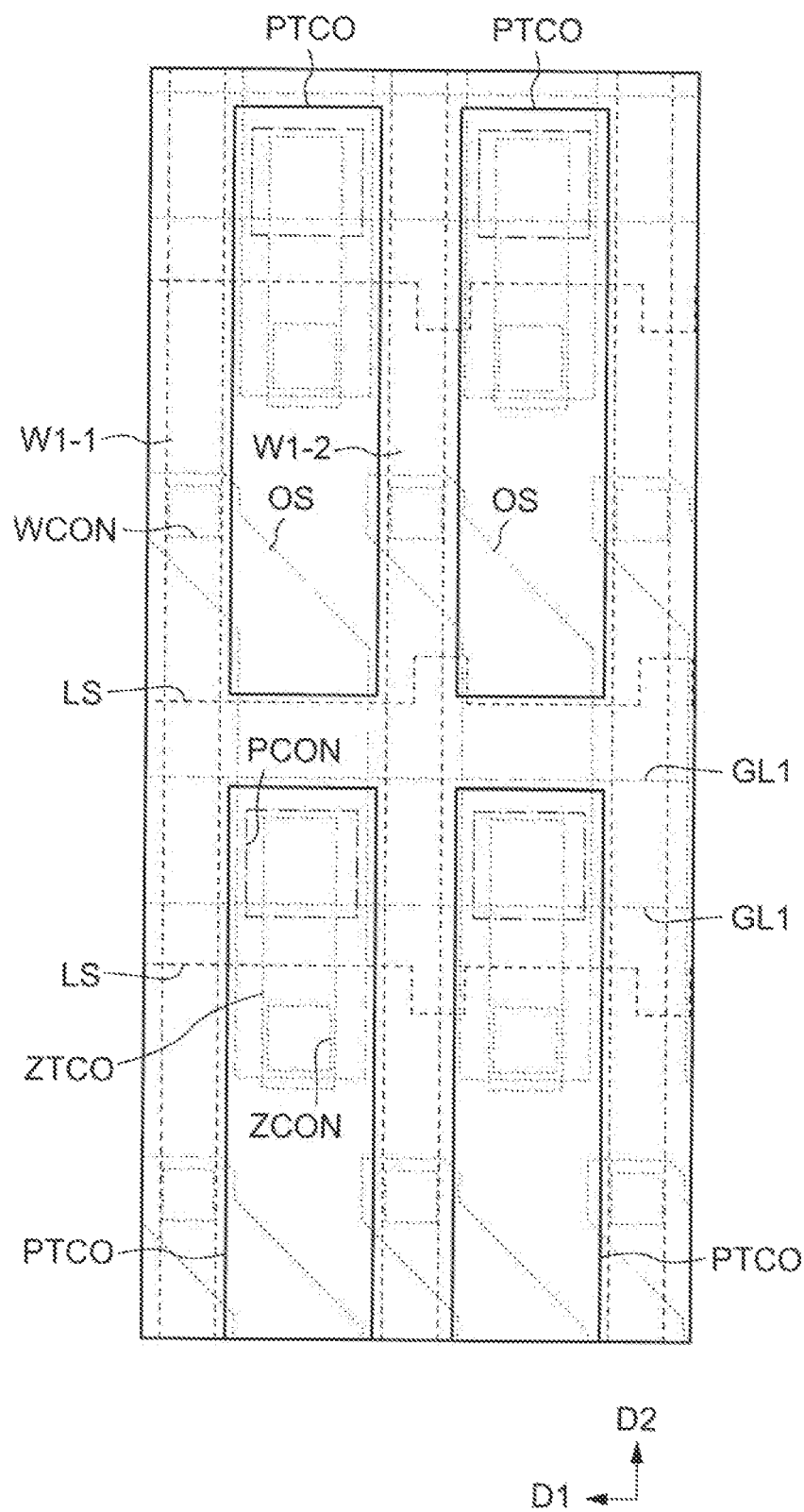
FIG. 11 is a plan view illustrating a layout of one or more layers in a display device according to an embodiment of the present invention.

As shown in FIG. 2, FIG. 10, and FIG. 11, the opening PCON is provided near an upper end of a pattern of the connecting electrode ZTCO. The opening PCON is provided in an area overlapping the pattern of the gate electrode GL1 and the pattern of the connecting electrode ZTCO. The opening PCON is provided in an area overlapping the pixel electrode PTCO. The pixel electrode PTCO overlaps the gate electrode GL1, the oxide semiconductor layer OS, and the connecting electrode ZTCO between the wiring W1-1 and the wiring W1-2. Therefore, the pixel electrode PTCO is in contact with the connecting electrode ZTCO in the opening PCON (the second contact area CON2) overlapping the gate electrode GL1.

The pixel electrode PTCO extends in a translucent area as described below. The pixel electrode PTCO may be referred to as a "second transparent conductive layer". In other words, the pixel electrode PTCO is formed in a long shape extending in the direction D2 similar to the oxide semiconductor layer OS and the wiring W1-1 (the first wiring). In the direction D1, a width of the pixel electrode PTCO is larger than the width of the oxide semiconductor layer OS at a part where the opening PCON is provided.

As shown in FIG. 11, the connecting electrode ZTCO is formed in a long shape extending along the wiring W1-1. In the direction D1, a width of the opening PCON constituting the second contact area CON2 is larger than the width of the connecting electrode ZTCO. The connecting electrode ZTCO entirely overlaps the pixel electrode PTCO in a plan view.

As shown in FIG. 11, the pixel electrodes PTCO are aligned in the direction D2. Of the pixels adjacent to the direction D2, one pixel may be referred to as a "first pixel", and the other pixel may be referred to as a "second pixel". For example, the first pixel is a pixel corresponding to the upper pixel electrode PTCO among the pixel electrodes PTCO aligned in the direction D2 in FIG. 11, and the second pixel is a pixel corresponding to the lower pixel electrode PTCO among the pixel electrodes PTCO aligned in the direction D2 in FIG. 11. In this case, the first pixel and the second pixel are supplied with a pixel signal from the wiring W1-1.

The pixel electrodes PTCO are aligned in the direction D1. A pixel adjacent in the direction D1 with respect to the above first pixel is referred to as a "third pixel", and a pixel adjacent in the direction D1 with respect to the second pixel is referred to as a "fourth pixel". The third pixel and the fourth pixel are adjacent to each other in the direction D2. The third pixel and the fourth pixel are supplied with the pixel signal from the wiring W1-2 (the second wiring) adjacent to the wiring W1-1.

As described above, each of the first pixel, the second pixel, the third pixel, and the fourth pixel includes the transistor Tr1 (pixel transistor), the connecting electrode ZTCO, and the pixel electrode PTCO.

The transistor Tr1 includes the oxide semiconductor layer OS, the gate electrode GL1 facing the oxide semiconductor layer OS, and the gate insulating layer GI1 between the oxide semiconductor layer OS and the gate electrode GL1. The connecting electrode ZTCO overlaps the gate electrode GL1 and the oxide semiconductor layer OS and contacts the oxide semiconductor layer OS in the opening ZCON (the first contact area CON1) not overlapped with the gate electrode GL1 in a plan view. The pixel electrode PTCO overlaps the gate electrode GL1, the oxide semiconductor layer OS, and the connecting electrode ZTCO and is connected to the connecting electrode ZTCO in the opening PCON overlapping the gate electrode GL1 (the second contact area CON2) in a plan view.

The pixel electrode PTCO of the first pixel provided on the upper side in FIG. 11 overlaps the oxide semiconductor layer OS of the first pixel and the oxide semiconductor layer OS of the second pixel provided on the lower side of the first pixel in a plan view. The pixel electrode PTCO of the first pixel also overlaps a part of the oxide semiconductor layer OS of the fourth pixel in a plan view.

As shown in FIG. 12, the common auxiliary electrode CMTL is provided in a grid shape so as to surround the periphery of a pixel area. That is, the common auxiliary electrode CMTL is provided commonly for multiple pixels. In other words, the common auxiliary electrode CMTL has an opening OP. The opening OP is provided to expose the pixel electrode PTCO. A pattern of the opening OP is provided inside the pattern of the pixel electrode PTCO. An area provided with the opening OP corresponds to a display area. That is, the opening ZCON is included in the display area. The display area means an area in which a user can see light from a pixel. For example, a frame area that is shielded by a metal layer and unperceivable to the user is not included in the display area. That is, the above display area may be referred to as a "translucent area (or opening area)".

As shown in FIG. 13, the common electrode CTCO is provided commonly for multiple pixels. A slit SL is provided in an area corresponding to the above opening OP. The slit SL has a curved shape (longitudinally long S-shape). A tip of the slit SL has a shape in which a width orthogonal to an extending direction of the tip is reduced. Referring to FIG. 1 and FIG. 13, the common electrode CTCO has the slit SL at a position facing the pixel electrode PTCO.

1-5. Materials of Each Member of Display Device 10

A rigid substrate having light transmittance and no flexibility, such as a glass substrate, a silica substrate, and a sapphire substrate can be used as the substrate SUB. On the other hand, in the case where the substrate SUB needs to have a flexibility, a flexible substrate containing a resin and having flexibility, such as a polyimide substrate, an acrylic substrate, a siloxane substrate, or a fluororesin substrate can be used as the substrate SUB. In order to improve the heat resistance of the substrate SUB, impurities may be introduced into the above resin.

General metal materials can be used as the gate electrodes GL1, GL2, the wirings W1, W2, the light-shielding layer LS, and the common auxiliary electrode CMTL. For example, aluminum (Al), titanium (Ti), chromium (Cr), cobalt (Co), nickel (Ni), molybdenum (Mo), hafnium (Hf), tantalum (Ta), tungsten (W), bismuth (Bi), and silver (Ag), or alloys or compounds thereof are used as members of these electrodes and the like. The above materials may be used in a single layer or a stacked layer as the members of the above electrodes and the like.

For example, a stacked structure of Ti/Al/Ti is used as the gate electrode GL1. In the present embodiment, the cross-sectional shape of a pattern end of the gate electrode GL1 having the above stacked structure is a forward taper shape.

General insulating materials can be used as the gate insulating layers GI1, GI2, and the insulating layers IL1 to IL5. For example, inorganic insulating layers such as silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), aluminum nitride ($AlN_x$), and the like can be used as the insulating layers IL1 to IL3, and IL5. Low-defect insulating layers can be used as these insulating layers. Organic insulating materials such as a polyimide resin, an acrylic resin, an epoxy resin, a silicone resin, a fluororesin, or a siloxane resin can be used as the insulating layer IL4. The above organic insulating materials may be used as the gate insulating layers GI1, GI2, and the insulating layers IL1 to IL3, IL5. The above materials may be used in a single layer or a stacked layer as a member of the insulating layer and the like.

$SiO_x$ with a thickness of 100 nm is used as the gate insulating layer GI1 as an example of the above insulating layer. $SiO_x/SiN_x/SiO_x$ with a total thickness of 600 nm to 700 nm is used as the insulating layer IL1. $SiO_x/SiN_x$ with a total thickness of 60 nm to 100 nm is used as the gate insulating layer GI2. $SiO_x/SiN_x/SiO_x$ with a total thickness of 300 nm to 500 nm is used as the insulating layer IL2. $SiO_x$ with a total thickness of 200 nm to 500 nm (single layer), $SiN_x$ (single layer), or a stacked layer thereof is used as the insulating layer IL3. The organic layer with a thickness of 2 µm to 4 µm is used as the insulating layer IL4. $SiN_x$ (single layer) with a thickness of 50 nm to 150 nm is used as the insulating layer IL5.

The above $SiO_xN_y$ and $AlO_xN_y$ are silicone compounds and aluminum compounds containing nitrogen (N) in a smaller ratio (x>y) than oxygen (O). The above $SiN_xO_y$ and $AlN_xO_y$ are silicon compounds and aluminum compounds containing oxygen in a smaller ratio (x>y) than nitrogen.

A metal oxide having semiconductor characteristics can be used as the oxide semiconductor layer OS. The oxide semiconductor layer OS has light transmittance. For example, an oxide semiconductor containing indium (In), gallium (Ga), zinc (Zn), and oxygen (O) can be used as the oxide semiconductor layer OS. In particular, an oxide semiconductor having a composition ratio of In:Ga:Zn:O=1:1:1:4 can be used. However, the oxide semiconductor containing In, Ga, Zn, and O used in the present embodiment is not limited to the above composition, and an oxide semiconductor having a composition different from that described above can also be used. For example, the ratio of In may be larger than that described above to improve mobility. The ratio of Ga may be larger to increase the band gap and reduce the influence of light irradiation.

Other elements may be added to the oxide semiconductor containing In, Ga, Zn, and O. For example, a metal element such as Al or Sn may be added to the oxide semiconductor. In addition to the oxide semiconductor described above, an oxide semiconductor containing In and Ga (IGO), an oxide semiconductor containing In and Zn (IZO), an oxide semiconductor containing In, Sn, and Zn (ITZO), and an oxide semiconductor containing In and W may be used as the oxide semiconductor layer OS. The oxide semiconductor layer OS may be amorphous or crystalline. The oxide semiconductor layer OS may be a mixed phase of amorphous and crystalline.

A transparent conductive layer is used as the connecting electrode ZTCO, the pixel electrode PTCO, and the common electrode CTCO. A mixture of indium oxide and tin oxide (ITO) and a mixture of indium oxide and zinc oxide (IZO) can be used as the transparent conductive layer. Materials other than the above may be used as the transparent conductive layer.

As described above, according to the display device 10 according to the present embodiment, conduction between the oxide semiconductor layer OS and the connecting electrode ZTCO can be ensured by directly contacting the oxide semiconductor layer OS and the connecting electrode ZTCO in the transistor Tr1. Therefore, there is no need to provide a metal layer between the oxide semiconductor layer OS and the connecting electrode ZTCO. With this configuration, since light is not blocked in the opening ZCON (the first contact area CON1), it is possible to suppress a decrease in the opening ratio. The oxide semiconductor layer has light transmittance. Therefore, in the present embodiment, although the oxide semiconductor layer is provided in an opening area of the pixel area, light from the backlight passes through the oxide semiconductor layer. Therefore, the reduction in the light transmittance in the opening area due to the oxide semiconductor layer provided in the opening area is reduced as much as possible. Since the oxide semiconductor layer OS has light transmittance, it is less likely to cause unevenness in transmitted light, unlike the silicon layer. Since the oxide semiconductor layer OS is provided in the display area, it is possible to suppress the occurrence of display unevenness.

2. Second Embodiment

Figure 14:
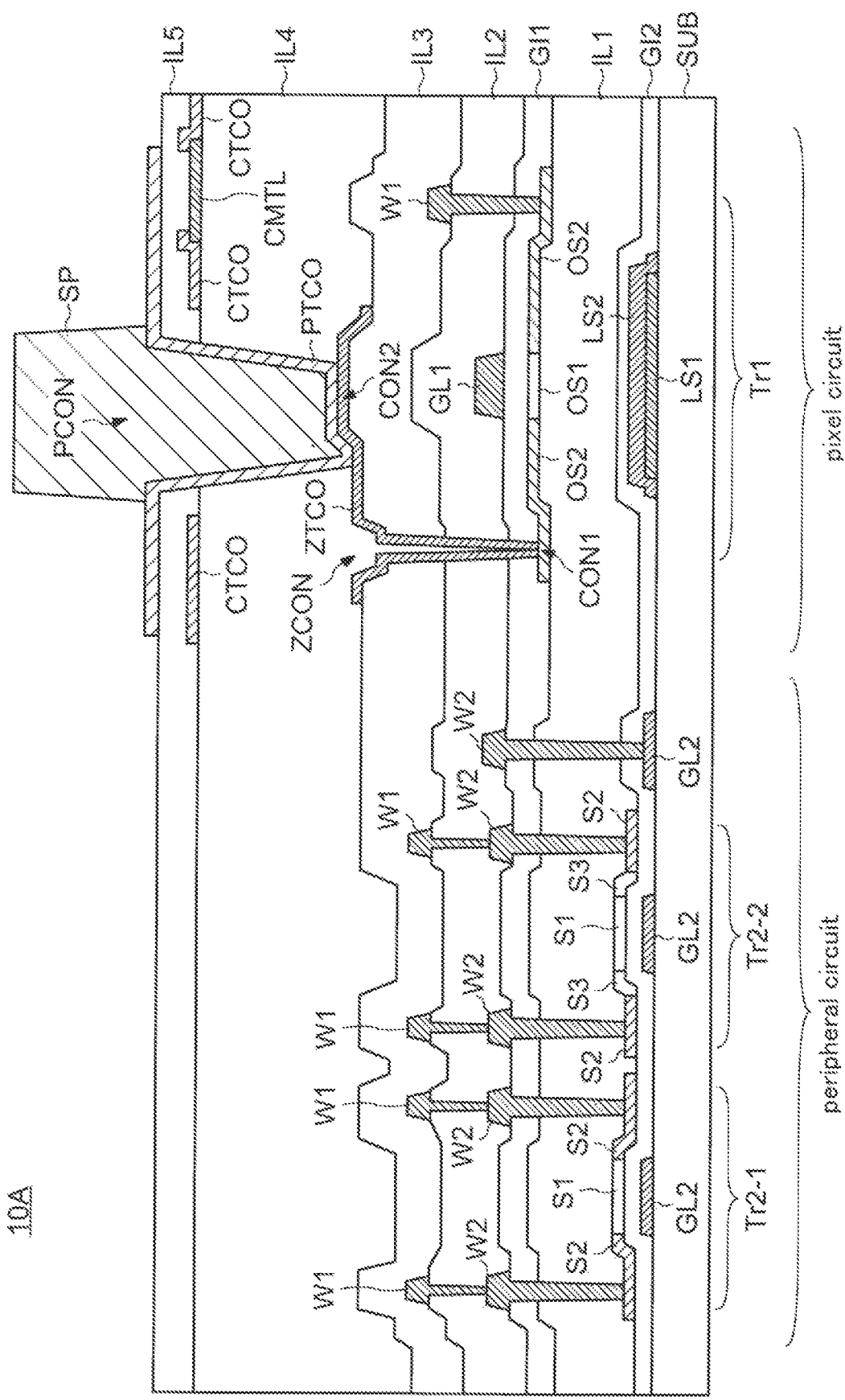
FIG. 14 is a cross-sectional view showing an outline of a display device according to an embodiment of the present invention.

A configuration of a display device 10A according to an embodiment of the present invention will be described with reference to FIG. 14. FIG. 14 is a cross-sectional view showing an outline of a display device according to an embodiment of the present invention. Although the display device 10A shown in FIG. 14 is similar to the display device 10 shown in FIG. 1, the positional relationship between the pixel electrode PTCO and the common electrode CTCO is different.

As shown in FIG. 14, the common auxiliary electrode CMTL and the common electrode CTCO are provided above the insulating layer IL4. The insulating layer IL5 is provided above the common auxiliary electrode CMTL and the common electrode CTCO. The pixel electrode PTCO is provided above the insulating layer IL5. The pixel electrode PTCO is connected to the connecting electrode ZTCO via the opening PCON provided in the insulating layers IL4 and IL5. As described above, the pixel electrode PTCO may be provided above the common electrode CTCO.

According to the display device 10A of the present embodiment, the same effects as those of the display device 10 of the first embodiment can be obtained.

Third Embodiment

An entire configuration of the display device described in the first embodiment and the second embodiment will be described with reference to FIG. 15 to FIG. 17.

Outline of Display Device 20B

Figure 15:
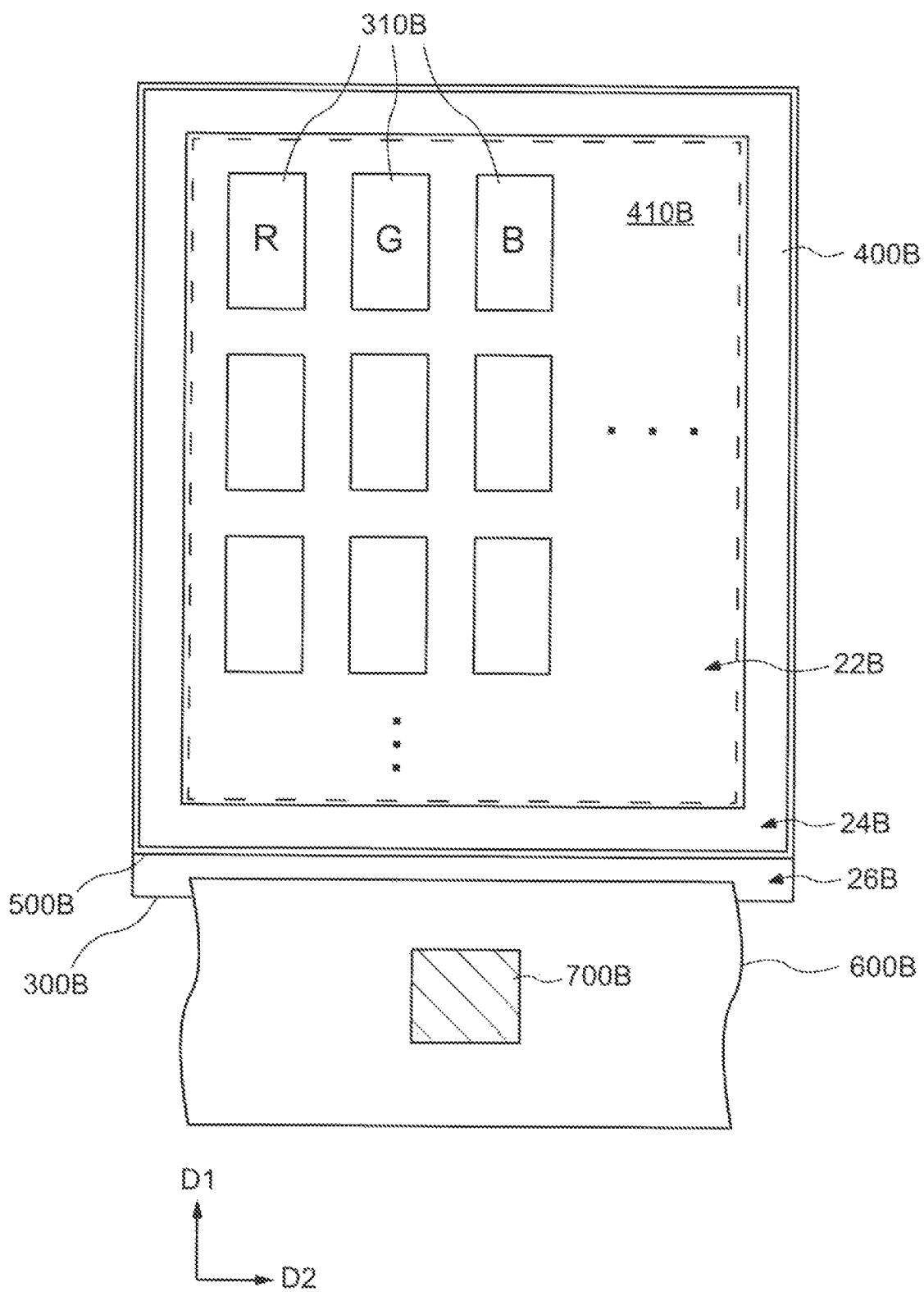
FIG. 15 is a plan view showing an outline of a display device according to an embodiment of the present invention.

FIG. 15 is a plan view showing an outline of a display device according to an embodiment of the present invention. As shown in FIG. 15, a display device 20B includes an array substrate 300B, a seal part 400B, a counter substrate 500B, a flexible printed circuit board 600B (FPC 600B), and an IC chip 700B. The array substrate 300B and the counter substrate 500B are bonded by the seal part 400B. Multiple pixel circuits 310B are arranged in a matrix in a liquid crystal area 22B surrounded by the seal part 400B. The liquid crystal area 22B is an area overlapping a liquid crystal element 410B described later in a plan view. The liquid crystal area 22B is an area configured to contribute to display. The liquid crystal area 22B may be referred to as a "display area". The transistor Tr1 (first transistor) is provided in the liquid crystal area 22B (display area).

A seal area 24B provided with the seal part 400B is an area around the liquid crystal area 22B. The FPC 600B is provided in a terminal area 26B. The terminal area 26B is an area where the array substrate 300B is exposed from the counter substrate 500B and provided outside the seal area 24B. The exterior side of the seal area means outside the area provided with the seal part 400B and outside the area surrounded by the seal part 400B. The IC chip 700B is provided on the FPC 600B. The IC chip 700B supplies a signal for driving each pixel circuit 310B. The seal area 24B or an area combined with the seal area 24B and the terminal area 26B is an area that surrounds the liquid crystal area 22B (display area). These areas may be referred to as a "frame area". The transistor Tr2 (the second transistor) is provided in the frame area.

Circuit Configuration of Display Device 20B

Figure 16:
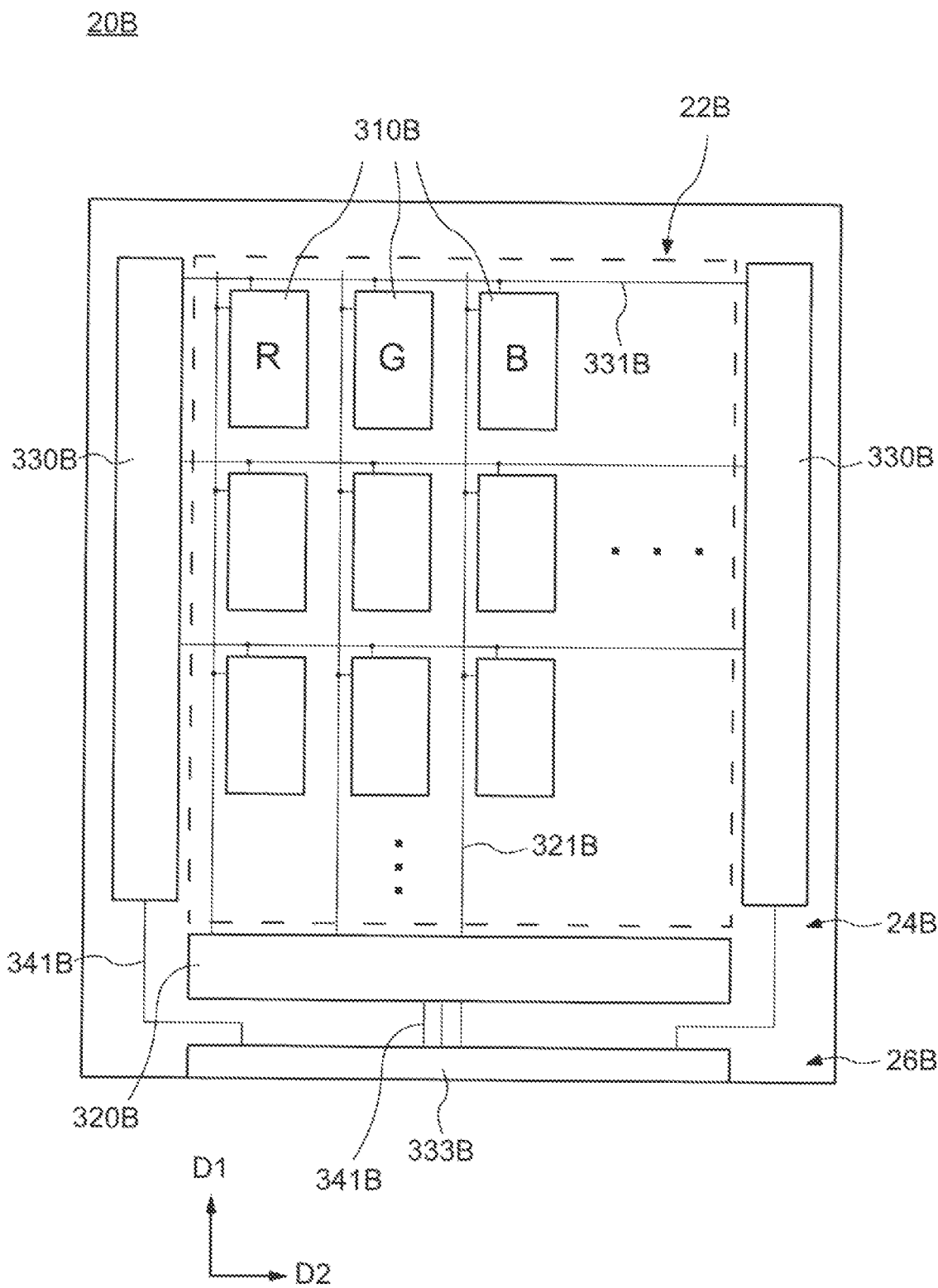
FIG. 16 is a block diagram showing a circuit configuration of a display device according to an embodiment of the present invention.

FIG. 16 is a block diagram showing a circuit configuration of a display device according to an embodiment of the present invention. As shown in FIG. 16, a source driver circuit 320B and the liquid crystal area 22B where the pixel circuit 310B is arranged are adjacent in the direction D1 (column direction), and the gate driver circuit 330B and the liquid crystal area 22B are adjacent in the direction D2 (row direction). The source driver circuit 320B and the gate driver circuit 330B are provided in the seal area 24B described above. However, the area where the source driver circuit 320B and the gate driver circuit 330B are provided is not limited to the seal area 24B, and it may be any area as long as it is the outside the area provided with the pixel circuit 310B.

A source wiring 321B extends in the direction D1 from the source driver circuit 320B and is connected to the multiple pixel circuits 310B arranged in the direction D1. A gate wiring 331B extends in the direction D2 from the gate driver circuit 330B and is connected to the multiple pixel circuits 310B arranged in the direction D2.

The terminal area 26B is provided with a terminal part 333B. The terminal part 333B and the source driver circuit 320B are connected by a connecting wiring 341B. Similarly, the terminal part 333B and the gate driver circuit 330B are connected by the connecting wiring 341B. When the FPC 600B is connected to the terminal part 333B, an external device to which the FPC 600B is connected and the display device 20B are connected, and each pixel circuit 310B provided in the display device 20B is driven by a signal from the external device.

The transistor Tr1 shown in the first embodiment and the second embodiment is used for the pixel circuit 310B. The transistor Tr2 shown in the first embodiment and the second embodiment is applied to the transistor included in the source driver circuit 320B and the gate driver circuit 330B.

Pixel Circuit 310B of Display Device 20B

Figure 17:
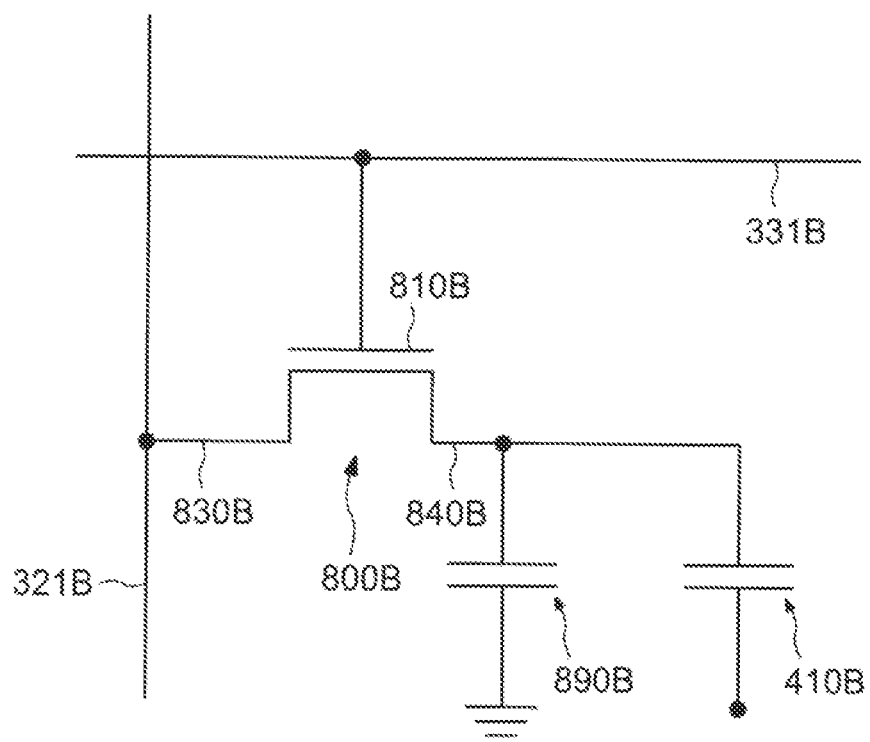
FIG. 17 is a circuit diagram showing a pixel circuit of a display device according to an embodiment of the present invention.

FIG. 17 is a circuit diagram showing a pixel circuit of a display device according to an embodiment of the present invention. As shown in FIG. 17, the pixel circuit 310B includes elements such as a transistor 800B, a storage capacitor 890B, and the liquid crystal element 410B. One electrode of the storage capacitor 890B is the pixel electrode PTCO and the other electrode is the common electrode CTCO. Similarly, one electrode of the liquid crystal element 410B is the pixel electrode PTCO and the other electrode is the common electrode CTCO. The transistor 800B includes a first gate electrode 810B, a first source electrode 830B, and a first drain electrode 840B. The first gate electrode 810B is connected to the gate wiring 331B. The first source electrode 830B is connected to the source wiring 321B. The first drain electrode 840B is connected to the storage capacitor 890B and the liquid crystal element 410B. The transistor Tr1 shown in the first embodiment and the second embodiment is applied to the transistor 800B shown in FIG. 17. In the present embodiment, for convenience of explanation, although 830B is referred to as a source electrode and 840B is referred to as a drain electrode, the function of each electrode as a source and a drain may be replaced.

Each of the embodiments described above as an embodiment of the present invention can be appropriately combined and implemented as long as they do not contradict each other. Further, the addition, deletion, or design change of components as appropriate by those skilled in the art based on each embodiment are also included in the scope of the present invention as long as they are provided with the gist of the present invention.

It is understood that, even if the effect is different from those provided by each of the above-described embodiments, the effect obvious from the description in the specification or easily predicted by persons ordinarily skilled in the art is apparently derived from the present invention.

What is claimed is:

1. A display device comprising:
a first transistor provided with an oxide semiconductor layer, a first gate electrode facing the oxide semiconductor layer and a first gate insulating layer between the oxide semiconductor layer and the first gate electrode;
a first transparent conductive layer overlapping the first gate electrode and the oxide semiconductor layer in a plan view, the first transparent conductive layer being in contact with the oxide semiconductor in a first contact area not overlapping the first gate electrode; and
a second transparent conductive layer overlapping the first gate electrode, the oxide semiconductor layer and the first transparent conductive layer in a plan view, the second transparent conductive layer being connected to the first transparent conductive layer in a second contact area overlapping the first gate electrode, wherein
the second transparent conductive layer extends to a translucent area of a pixel, and
the first contact area is included in the translucent area in a plan view.

2. The display device according to claim 1, further comprising
a first wiring to which a signal related to pixel gradation is transmitted,
wherein the first contact area is provided in an area not overlapping the first gate electrode and the first wiring.

3. A display device comprising:
a first transistor provided with an oxide semiconductor layer, a first gate electrode facing the oxide semiconductor layer and a first gate insulating layer between the oxide semiconductor layer and the first gate electrode;
a first transparent conductive layer overlapping the first gate electrode and the oxide semiconductor layer in a plan view, the first transparent conductive layer being in contact with the oxide semiconductor in a first contact area not overlapping the first gate electrode;
a second transparent conductive layer overlapping the first gate electrode, the oxide semiconductor layer and the first transparent conductive layer in a plan view, the second transparent conductive layer being connected to the first transparent conductive layer in a second contact area overlapping the first gate electrode; and
a light-shielding layer provided in an area where at least the first gate electrode and the oxide semiconductor layer overlap in a plan view,
wherein the first contact area is provided in an area not overlapping the light-shielding layer.

4. The display device according to claim 3, further comprising
a second transistor provided with a semiconductor layer, a second gate electrode facing the semiconductor layer and a second gate insulating layer between the semiconductor layer and the second gate electrode,
wherein the second gate electrode and the light-shielding layer are provided in the same layer.

5. The display device according to claim 4, further comprising
a wiring connected to the semiconductor layer,
wherein the first gate electrode and the wiring are provided in the same layer.

6. The display device according to claim 4, further comprising:
a display area configured to contribute to display; and
a frame area surrounding the display area,
wherein
the first transistor is provided in the display area, and
the second transistor is provided in the frame area.

7. The display device according to claim 2, wherein the oxide semiconductor layer is formed in a long shape intersecting the gate electrode, connected to the first wiring at a first end of the oxide semiconductor layer in a longitudinal direction of the oxide semiconductor layer, and connected to the first transparent conductive layer at a second end of the oxide semiconductor, and
the second end is opposite to the first end with respect to the oxide semiconductor layer in the longitudinal direction.

8. The display device according to claim 7, wherein
the first transparent conductive layer is formed in a long shape extending in the same direction as the oxide semiconductor layer, and
a width of the first transparent conductive layer is smaller than a width of the oxide semiconductor layer in a direction orthogonal to the longitudinal direction.

9. The display device according to claim 8, wherein
the second transparent conductive layer is formed in a long shape extending in the same direction as the oxide semiconductor layer, and
a width of the second transparent conductive layer is larger than the width of the oxide semiconductor layer in a direction orthogonal to the longitudinal direction.

10. The display device according to claim 7, wherein
the second transparent conductive layer is formed in a long shape extending in the same direction as the oxide semiconductor layer, and
a width of the second transparent conductive layer is larger than a width of the oxide semiconductor layer in a direction orthogonal to the longitudinal direction.

11. The display device according to claim 2, wherein
the first transparent conductive layer is formed in a long shape extending along the first wiring, and
a width of an opening constituting the second contact area is larger than a width of the first transparent conductive layer in a direction orthogonal to the longitudinal direction of the first transparent conductive layer.

12. The display device according to claim 4, further comprising
a display area configured to contribute to display and a frame area surrounding the display area,
wherein
the first transistor is provided in the display area, and
the second transistor is provided in the frame area.

13. The display device according to claim 2, wherein
the oxide semiconductor layer is formed in a long shape intersecting the first gate electrode, connected to the first wiring at one end of the oxide semiconductor layer in a longitudinal direction of the oxide semiconductor layer, and connected to the first transparent conductive layer at the other end of the oxide semiconductor layer in the longitudinal direction of the oxide semiconductor layer.

14. The display device according to claim 13, wherein
the first transparent conductive layer is formed in a long shape extending in the same direction as the oxide semiconductor layer, and
a width of the first transparent conductive layer is smaller than a width of the oxide semiconductor layer in a direction orthogonal to the longitudinal direction.

15. The display device according to claim 14, wherein
the second transparent conductive layer is formed in a long shape extending in the same direction as the oxide semiconductor layer, and
a width of the second transparent conductive layer is larger than a width of the oxide semiconductor layer in a direction orthogonal to the longitudinal direction.

16. A display device comprising:
a first pixel and a second pixel to both of which pixel signals are supplied from a first wiring,
wherein
each of the first pixel and the second pixel includes:
a pixel transistor provided with an oxide semiconductor layer, a gate electrode facing the oxide semiconductor layer and a gate insulating layer between the oxide semiconductor layer and the gate electrode;
a first transparent conductive layer overlapping the gate electrode and the oxide semiconductor layer in a plan view, the first transparent conductive layer being in contact with the oxide semiconductor in a first contact area not overlapping the first gate electrode; and
a second transparent conductive layer overlapping the gate electrode, the oxide semiconductor layer, and the first transparent conductive layer in a plan view, the second transparent conductive layer being connected to the first transparent conductive layer in a second contact area overlapping the gate electrode; and
the second transparent conductive layer of the first pixel overlaps the oxide semiconductor layer of the first pixel and the oxide semiconductor layer of the second pixel.

17. The display device according to claim 16, wherein
the second transparent conductive layer of the first pixel and the second transparent conductive layer of the second pixel face a common electrode via an insulating film.

18. The display device according to claim 17, wherein the common electrode has a slit at a position facing the second transparent conductive layer of the first pixel and the second transparent conductive layer of the second pixel.

19. A display device comprising:
a first pixel and a second pixel to both of which pixel signals are supplied from a first wiring; and
a third pixel and a fourth pixel to both of which pixel signals are supplied from a second wiring adjacent to the first and the second pixel,
wherein each of the first pixel, second pixel, third pixel and the fourth pixel includes;
a first transistor provided with an oxide semiconductor layer, a gate electrode facing the oxide semiconductor layer and a gate insulating layer between the oxide semiconductor layer and the gate electrode;

a first transparent conductive layer overlapping the gate electrode and the oxide semiconductor layer in a plan view, the first transparent conductive layer being in contact with the semiconductor layer in an area not overlapping the gate electrode; and a second transparent conductive layer overlapping the gate electrode, the oxide semiconductor layer and the first transparent conductive layer in a plan view, the second transparent conductive layer connected to the first transparent conductive layer in a second contact area overlapping the gate electrode, the first pixel and the third pixel are adjacent to each other, the second pixel and the fourth pixel are adjacent to each other, and the second transparent conductive layer of the first pixel overlaps the oxide semiconductor layer of the first pixel and the oxide semiconductor layer of the second pixel, and overlaps an oxide semiconductor layer of the fourth pixel.

* * * * *